(12) United States Patent
Takagi

(10) Patent No.: US 11,532,680 B2
(45) Date of Patent: Dec. 20, 2022

(54) LIGHT EMITTING ELEMENT AND DISPLAY DEVICE INCLUDING LIGHT EMITTING ELEMENT

(71) Applicant: Sony Group Corporation, Tokyo (JP)

(72) Inventor: Akitsuna Takagi, Tokyo (JP)

(73) Assignee: Sony Group Corporation, Tokyo (JP)

( * ) Notice: Subject to any disclaimer, the term of this patent is extended or adjusted under 35 U.S.C. 154(b) by 2 days.

(21) Appl. No.: 16/908,101

(22) Filed: Jun. 22, 2020

(65) Prior Publication Data

US 2020/0321416 A1    Oct. 8, 2020

Related U.S. Application Data

(63) Continuation of application No. 16/300,172, filed as application No. PCT/JP2017/015612 on Apr. 18, 2017, now Pat. No. 10,727,287.

(30) Foreign Application Priority Data

Jun. 7, 2016   (JP) .............................. JP2016-113378

(51) Int. Cl.
*H01L 27/32*   (2006.01)
*H01L 51/52*   (2006.01)
*G09F 9/30*    (2006.01)

(52) U.S. Cl.
CPC ............ *H01L 27/3251* (2013.01); *G09F 9/30* (2013.01); *H01L 51/5209* (2013.01); *H01L 51/5225* (2013.01); *H01L 51/5253* (2013.01); *H01L 27/322* (2013.01)

(58) Field of Classification Search
CPC ............. H01L 27/3251; H01L 51/5209; H01L 51/5225; H01L 51/5253; H01L 27/322; H01L 27/3244; H01L 27/32; H01L 51/5203; G09F 9/30; H05B 33/22; H05B 33/26

See application file for complete search history.

(56) References Cited

U.S. PATENT DOCUMENTS

| | | | |
|---|---|---|---|
| 10,727,287 B2 * | 7/2020 | Takagi | ................ H01L 51/5225 |
| 2005/0073247 A1 | 4/2005 | Yamazaki et al. | |
| 2006/0246620 A1 | 11/2006 | Nagayama et al. | |

(Continued)

FOREIGN PATENT DOCUMENTS

| | | | |
|---|---|---|---|
| JP | 2005129519 A | 5/2005 | |
| JP | 2005-276667 A | 10/2005 | |

(Continued)

OTHER PUBLICATIONS

Korean Office Action dated Feb. 25, 2021 for corresponding Korean Application No. 10-2018-7031155.

*Primary Examiner* — Selim U Ahmed
(74) *Attorney, Agent, or Firm* — Michael Best & Friedrich LLP

(57) ABSTRACT

A light emitting element 10 includes a base body 26, a first electrode 31 formed on the base body 26, an organic layer 33 formed on the first electrode 31 and having at least a light emitting layer, and a second electrode 32 formed on the organic layer 33. The second electrode 32 has at least two edge portions 32A and 32B opposed to each other, and each of the edge portions 32A and 32B of the second electrode 32 protrudes from an end face 33' of the organic layer 33.

16 Claims, 9 Drawing Sheets

(56) References Cited

U.S. PATENT DOCUMENTS

| | | | | |
|---|---|---|---|---|
| 2010/0078627 A1* | 4/2010 | Yoshinaga | .......... | H01L 27/3246 257/40 |
| 2015/0179681 A1* | 6/2015 | Sato | .................... | H01L 27/1255 257/43 |
| 2015/0287768 A1* | 10/2015 | Sato | .................... | H01L 27/3232 257/40 |

FOREIGN PATENT DOCUMENTS

| | | | |
|---|---|---|---|
| JP | 2008-098148 | A | 4/2008 |
| KR | 20050111338 | A | 11/2005 |
| KR | 20060033724 | A | 4/2006 |
| KR | 20130129934 | A | 11/2013 |
| WO | 2004/107821 | A1 | 12/2004 |
| WO | 2004/110105 | A1 | 12/2004 |

* cited by examiner

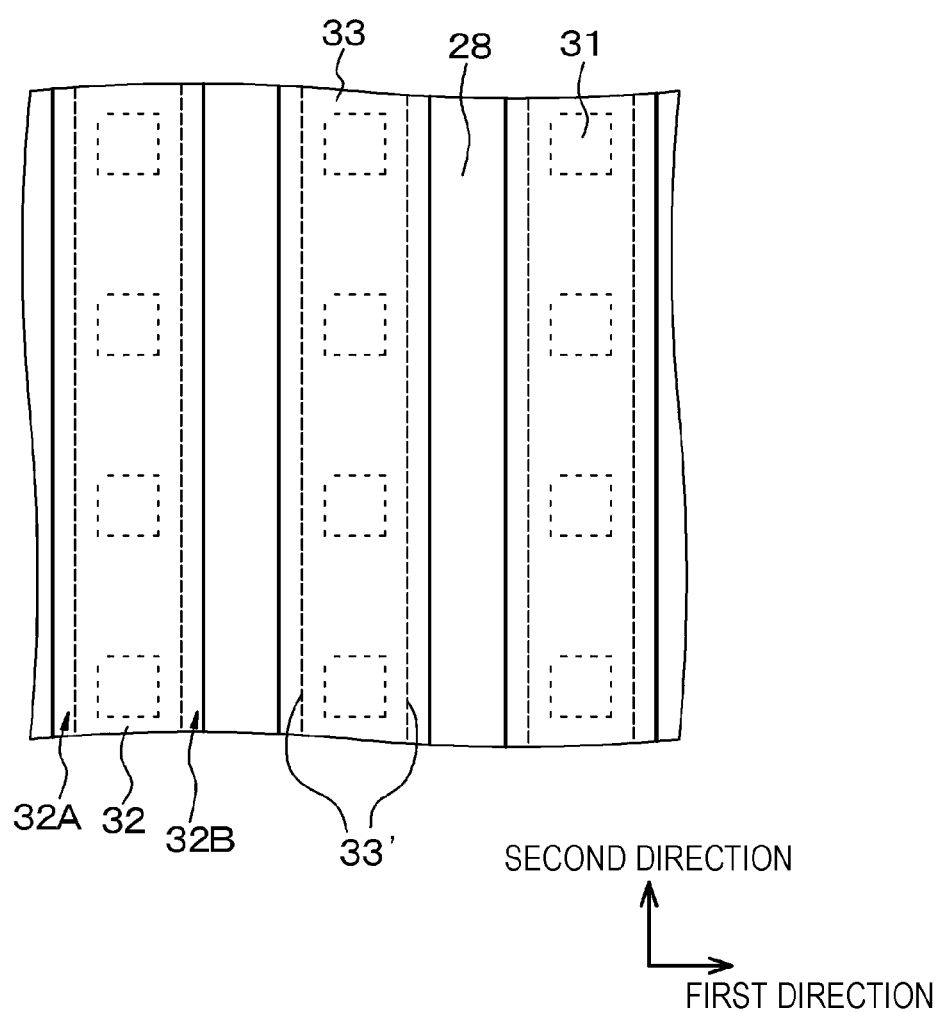

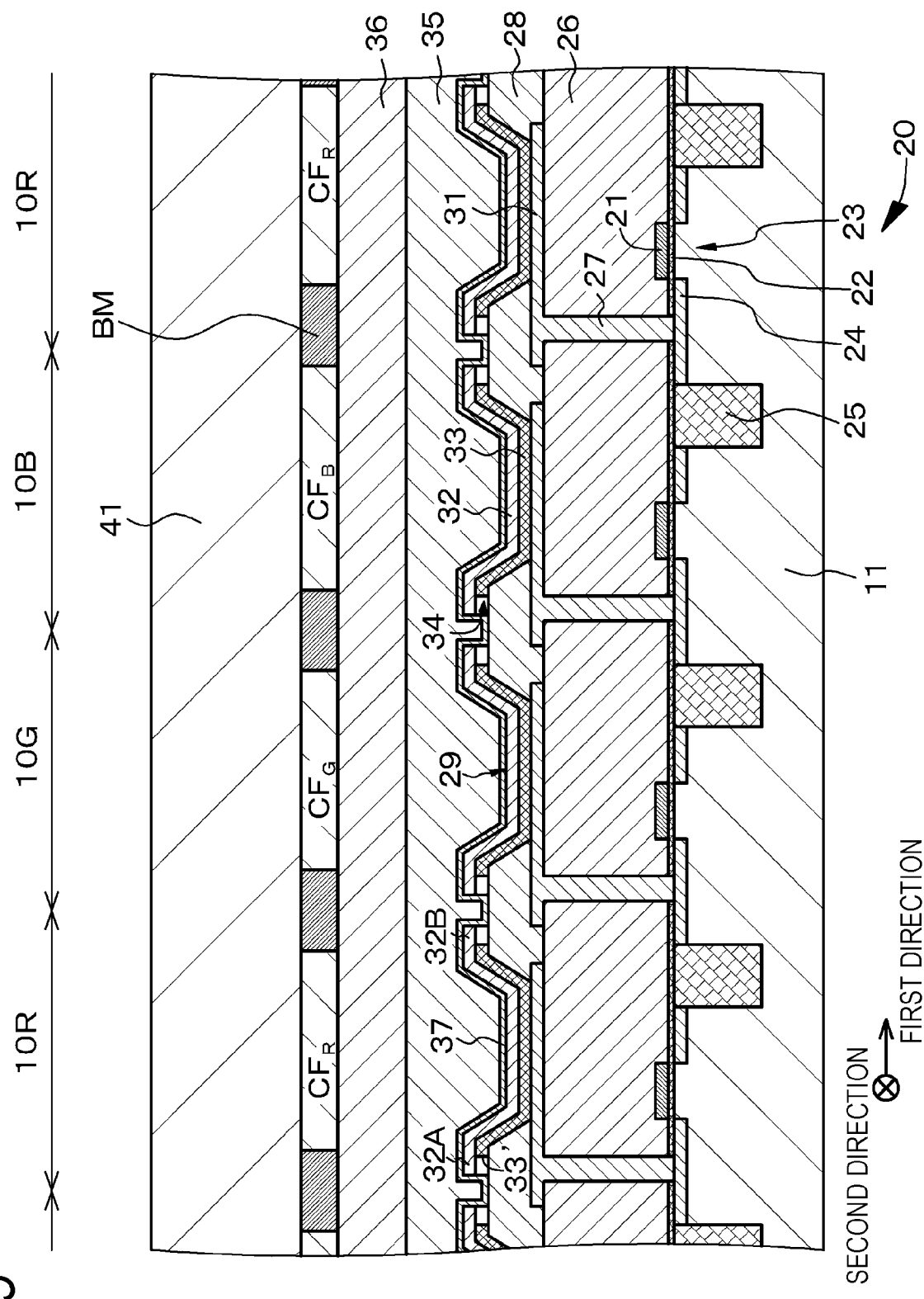

LIGHT EMITTING ELEMENT AND DISPLAY DEVICE INCLUDING LIGHT EMITTING ELEMENT

CROSS-REFERENCE TO RELATED APPLICATIONS

This application is a Continuation Application of the U.S. patent application Ser. No. 16/300,172, filed on Nov. 9, 2018, which is the U.S. national stage entry, under 35 U.S.C. § 371, of International Application No. PCT/JP2017/015612, filed Apr. 18, 2017, which claims priority to Japanese Application No. 2016-113378, filed with the Japanese Patent Office on Jun. 7, 2016, the contents of which are incorporated by reference herein in their entirety.

TECHNICAL FIELD

The present disclosure relates to a light emitting element and a display device including a plurality of the light emitting elements.

BACKGROUND ART

In recent years, development of a display device (organic EL display) using an organic electroluminescence (EL) element as a light emitting element is progressing. In this display device, for example, an organic layer including at least a light emitting layer and a second electrode (upper electrode) are formed on a first electrode (lower electrode) formed so as to be isolated for each pixel. In the organic layer, a charge injection layer is further formed between the first electrode and the light emitting layer. Furthermore, for example, each of a red light emitting element that emits red light, a green light emitting element that emits green light, and a blue light emitting element that emits blue light are each disposed as a sub-pixel, and these sub-pixels constitute one pixel. Alternatively, a red light emitting element obtained by combining a light emitting element that emits white light and a red color filter, a green light emitting element obtained by combining a light emitting element that emits white light and a green color filter, and a blue light emitting element obtained by combining a light emitting element that emits white light and a blue color filter are each disposed as a sub-pixel, and these sub-pixels constitute one pixel. In addition, in each of the light emitting elements, an organic layer is patterned and has an end face.

By the way, when the end face of the organic layer comes into contact with the second electrode formed on the organic layer, a current flows not only between a top face of the organic layer and the second electrode but also between the end face of the organic layer and the second electrode. Note that the current in this case is not a recombination current but a conduction current for the most part. In addition, flowing of a current between the end face of the organic layer and the second electrode causes brightness variation among pixels particularly at the time of low gradation, leading to deterioration in display image quality. A structure in which an end face of an organic layer is filled with an insulation layer containing $SiO_2$ such that the end face of the organic layer is not exposed to a second electrode has been proposed (refer to, for example, Japanese Patent Application Laid-Open No. 2005-276667).

CITATION LIST

Patent Document

Patent Document 1: Japanese Patent Application Laid-Open No. 2005-276667

SUMMARY OF THE INVENTION

Problems to be Solved by the Invention

However, a step of filling the end face of the organic layer with the insulation layer containing $SiO_2$ usually requires a high film formation temperature, and therefore the organic layer is easily damaged. Furthermore, when the insulation layer is partially patterned, the organic layer is easily damaged, and therefore it is difficult to say that the step is preferable.

Therefore, an object of the present disclosure is to provide a light emitting element having a configuration and a structure capable of preventing occurrence of damage to an organic layer and suppressing flowing of a current (leak current) between an end face of the organic layer and a second electrode, and a display device including a plurality of the light emitting elements.

Solutions to Problems

A light emitting element of the present disclosure in order to achieve the above object includes:
a base body;
a first electrode formed on the base body;
an organic layer formed on the first electrode and having at least a light emitting layer; and
a second electrode formed on the organic layer.
The second electrode has at least two edge portions opposed to each other, and
each of the edge portions of the second electrode protrudes from an end face of the organic layer.

A display device of the present disclosure in order to achieve the above object includes:
a first substrate; a second substrate; and
a plurality of light emitting elements positioned between the first substrate and the second substrate and arranged in a two-dimensional matrix.
Each of the light emitting elements includes:
a first electrode formed on a base body disposed on the first substrate;
an organic layer formed on the first electrode and having at least a light emitting layer; and
a second electrode formed on the organic layer.
The second electrode has at least two edge portions opposed to each other, and
each of the edge portions of the second electrode protrudes from an end face of the organic layer.

Alternatively, a display device of the present disclosure includes: a first substrate; a second substrate; and an image display unit sandwiched by the first substrate and the second substrate.

In the image display unit, a plurality of the light emitting elements of the present disclosure is arranged in a two-dimensional matrix.

Effects of the Invention

In the light emitting element of the present disclosure or a light emitting element constituting the display device of the present disclosure, each of the edge portions of the second electrode protrudes from the end face of the organic layer. In other words, no organic layer is present immediately below each of the edge portions of the second electrode, and the second electrode is not in direct contact with the end face of the organic layer. Therefore, a current flows between a top face of the organic layer and the second electrode, but it is possible to prevent a current from flowing between the end face of the organic layer and the second electrode. As a result, occurrence of brightness variation among pixels can be suppressed, and display image quality is not deteriorated. In addition, in a step of providing such a configuration and structure, the organic layer is not damaged. Note that effects described here are merely illustrative, and are not restrictive. Furthermore, an additional effect may be present.

BRIEF DESCRIPTION OF DRAWINGS

FIG. 2 is a schematic view of a part of the display device of Example 1 as viewed from above.

FIG. 5 is a schematic partial cross-sectional view of a display device of Example 3.

MODE FOR CARRYING OUT THE INVENTION

Figure 1:
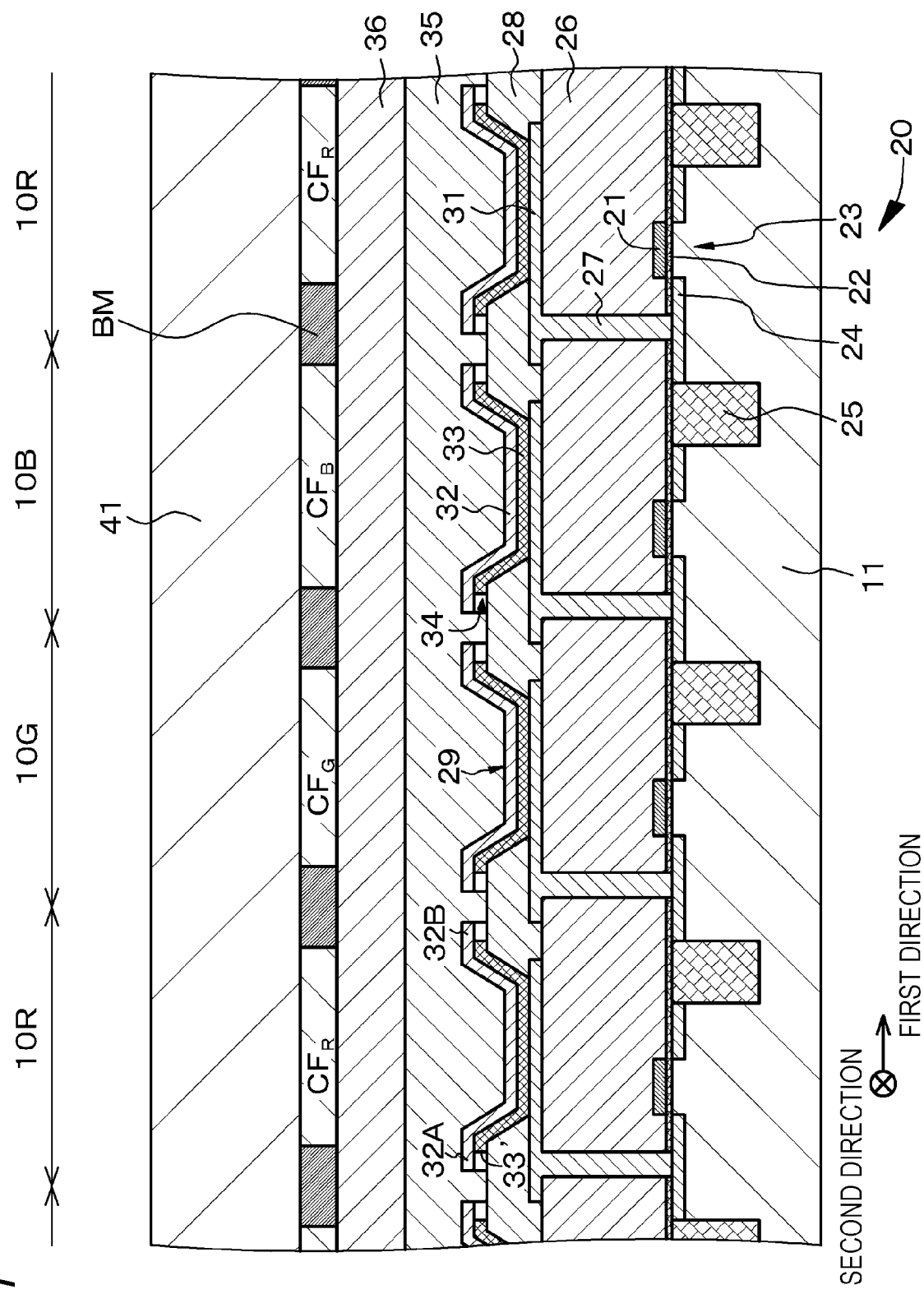
FIG. 1 is a schematic partial cross-sectional view of a display device of Example 1.

Hereinafter, the present disclosure will be described on the basis of Examples with reference to the drawings. However, the present disclosure is not limited to Examples, and various numerical values and materials in Examples are illustrative. Note that description will be made in the following order.

1. General description on light emitting element of the present disclosure and display device of the present disclosure
2. Example 1 (light emitting element of the present disclosure and display device of the present disclosure)
3. Example 2 (modification of Example 1)
4. Example 3 (another modification of Example 1)
5. Others <General Description on Light Emitting Element of the Present Disclosure and Display Device of the Present Disclosure>

In a light emitting element of the present disclosure or a light emitting element constituting a display device of the present disclosure (hereinafter, these light emitting elements are collectively referred to as "light emitting element of the present disclosure or the like"), a void may be present immediately below an edge portion of a second electrode protruding from an end face of an organic layer. For convenience, such a mode is referred to as a "first mode". Alternatively, a protective film covering the second electrode may be further included, and the protective film may extend immediately below the edge portion of the second electrode protruding from the end face of the organic layer. For convenience, such a mode is referred to as a "second mode". Alternatively, a protective film covering the second electrode may be further included, a void may be present adjacent to the organic layer in a part immediately below the edge portion of the second electrode protruding from the end face of the organic layer, and the protective film may extend to another portion immediately below the edge portion of the second electrode protruding from an edge portion of the organic layer. For convenience, such a mode is referred to as a "third mode".

Note that these three modes may be mixed in one light emitting element. In other words, one light emitting element may have the first mode, may have the second mode, may have the third mode, may have the first mode and the second mode, may have the first mode and the third mode, may have the second mode and the third mode, and may have the first mode, the second mode, and the third mode. Furthermore, as light emitting elements constituting the display device, light emitting elements having any of these modes may be mixed. Whether a light emitting element is in the first mode, the second mode, or the third mode depends on the length of the edge portion of the second electrode protruding from the end face of the organic layer, the thickness of the second electrode or the organic layer, film formation conditions of the protective film, and the like.

In the light emitting element of the present disclosure or the like, including the above various preferable modes, an insulation layer formed on the base body and having an opening in which the first electrode is exposed to a bottom may be further included, and the organic layer may be formed at least on the first electrode exposed to the bottom of the opening. In addition, in this case, the insulation layer may be formed so as to cover a portion from the first electrode to the base body.

Alternatively, in the light emitting element of the present disclosure or the like, including the above various preferable embodiments, an insulation layer formed on the base body and formed so as to surround the first electrode may be further included.

In the light emitting element of the present disclosure or the like, including the above-described various preferable modes and configurations, the second electrode may be isolated at a portion between light emitting elements adjacent in a first direction, the second electrode may be common to light emitting elements adjacent in a second direction different from the first direction, the second electrode may have two edge portions opposed to each other, and the two edge portions opposed to each other may extend in the second direction. Note that the light emitting element in such a mode may be referred to as "light emitting element according to a first embodiment of the present disclosure" for convenience. In the light emitting element according to the first embodiment of the present disclosure, the organic layer continuously extends in the second direction, or is isolated at a portion between a light emitting element and a light emitting element in the second direction, and is isolated at a portion between a light emitting element and a light emitting element in the first direction. Alternatively, the second electrode may be isolated at a portion between light emitting elements adjacent in the first direction, and may be isolated at a portion between light emitting elements adjacent in the second direction different from the first direction, the second electrode may have four edge portions opposed to one another, two of the edge portions opposed to each other may extend in the first direction, and the remaining two edge portions opposed to each other may extend in the second direction. In addition, in this case, a common electrode (so-called solid electrode) common to adjacent light emitting elements may be formed on the second electrode. Note that the light emitting element in such a mode may be referred to as "light emitting element according to a second embodiment of the present disclosure" for convenience. Here, the organic layer is isolated at a portion between a light emitting element and a light emitting element in the second direction, and is also isolated at a portion between a light emitting element and a light emitting element in the first direction. In some cases, the organic layer continuously extends in the second direction and is isolated at a portion between a light emitting element and a light emitting element in the first direction. The first direction is preferably orthogonal to the second direction.

The display device of the present disclosure or the like, including the above-described various preferable modes and configurations, may be constituted by an organic electroluminescence display device (organic EL display device). Furthermore, the light emitting element of the present disclosure or the like, including the above-described various preferable modes and configurations (hereinafter, these light emitting elements are collectively referred to as "light emitting element in the present disclosure or the like"), may be constituted by an organic electroluminescence element (organic EL element).

In the light emitting element in the present disclosure or the like, the light emitting layer may be constituted by at least two light emitting layers that emit different colors. In this case, light emitted from the organic layer may be white. Specifically, the light emitting layer may have a structure obtained by laminating three layers of a red light emitting layer that emits red light (wavelength: 620 nm to 750 nm), a green light emitting layer that emits green light (wavelength: 495 nm to 570 nm), and a blue light emitting layer that emits blue light (wavelength: 450 nm to 495 nm), and emits white light as a whole. Alternatively, the light emitting layer may have a structure obtained by laminating two layers of a blue light emitting layer that emits blue light and a yellow light emitting layer that emits yellow light, and emits white light as a whole. Alternatively, the light emitting layer may have a structure obtained by laminating two layers of a blue light emitting layer that emits blue light and an orange light emitting layer that emits orange light, and emits white light as a whole. In addition, such a white light emitting element that emits white light includes a red color filter to constitute a red light emitting element. The white light emitting element includes a green color filter to constitute a green light emitting element. The white light emitting element includes a blue color filter to constitute a blue light emitting element. In addition, a combination of sub-pixels such as a red light emitting element, a green light emitting element, and a blue light emitting element constitutes one pixel. In some cases, a red light emitting element, a green light emitting element, a blue light emitting element, and a light emitting element that emits white (or a light emitting element that emits complementary color light) may constitute one pixel. Note that, in a mode constituted by at least two light emitting layers that emit light of different colors, there is actually a case where the light emitting layers that emit light of different colors are mixed and are not clearly separated into the layers.

The color filter is constituted by a resin to which a coloring agent containing a desired pigment or dye is added. By selecting a pigment or a dye, adjustment is performed such that light transmittance in a target wavelength range of red, green, blue, or the like is high, and light transmittance in the other wavelength ranges is low. In a light emitting element that emits white light, it is only required to dispose a transparent filter.

Alternatively, the light emitting layer may be constituted by one light emitting layer. In this case, for example, the light emitting element may be constituted by, a red light emitting element having an organic layer including a red light emitting layer, a green light emitting element having an organic layer including a green light emitting layer, or a blue light emitting element having an organic layer including a blue light emitting layer. Alternatively, the light emitting layer may be constituted by a plurality of light emitting layers. In this case, for example, the light emitting element may have a structure in which an organic layer including a red light emitting layer, an organic layer including a green light emitting layer, an organic layer including a blue light emitting layer, and the like are laminated, or may be constituted by a red light emitting element having an organic layer including a plurality of red light emitting layers, a green light emitting element having an organic layer including a plurality of green light emitting layers, or a blue light emitting element having an organic layer including a plurality of blue light emitting layers. In a case of a display device of color display, these three kinds of light emitting elements (sub-pixels) constitute one pixel.

A black matrix layer may be formed between a color filter and a color filter or between a light emitting element and a light emitting element. For example, the black matrix layer is constituted by a black resin film (specifically, for example, a black polyimide resin) having an optical density of 1 or more, mixed with a black coloring agent, or a thin film filter utilizing interference of a thin film. For example, the thin film filter is formed by laminating two or more thin films including metal, metal nitride, or metal oxide, and attenuates light by utilizing interference of a thin film. Specific examples of the thin film filter include a thin film filter obtained by alternately laminating Cr and chromium(III) oxide ($Cr_2O_3$).

The base body may include an interlayer insulation layer. Below the base body (interlayer insulation layer), a light emitting element driving unit is disposed although the present disclosure is not limited thereto. For example, the light emitting element driving unit includes a transistor (specifically, for example, MOSFET) formed on a silicon semiconductor substrate constituting a first substrate or a thin film transistor (TFT) disposed on various substrates each constituting the first substrate. The transistor and the TFT constituting the light emitting element driving unit may be connected to the first electrode via a contact hole (contact plug) formed in the base body. The light emitting element driving unit may have a known circuit configuration. The second electrode or the common electrode is connected to the light emitting element driving unit via a contact hole (contact plug) formed in the base body at an outer periphery of the display device.

In another expression, as described above, the display device of the present disclosure includes a first substrate, a second substrate, and an image display unit sandwiched by the first substrate and the second substrate. In the image display unit, a plurality of the light emitting elements of the present disclosure, including the above-described preferable modes and configurations, is arranged in a two-dimensional matrix. Here, the light emitting elements are formed on a side of the first substrate.

The display device of the present disclosure may be a top emission type display device that emits light from the second substrate. In the top emission type display device, it is only required to form a color filter and a black matrix layer on a surface side of the second substrate opposed to the first substrate. Alternatively, a color filter may be formed on a surface side of the first substrate opposed to the second substrate. In other words, an on-chip color filter (OCCF) may be formed on the first substrate. Alternatively, the display device of the present disclosure may be a bottom emission type display device that emits light from the first substrate.

In the display device according to the first embodiment of the present disclosure, examples of an arrangement of pixels (or sub-pixels) include a stripe arrangement. Furthermore, in the light emitting element according to the second embodiment of the present disclosure, examples of an arrangement of pixels (or sub-pixels) include a stripe arrangement, a diagonal arrangement, a delta arrangement, a stripe arrangement, a rectangle arrangement, and a pentile arrangement.

The first substrate or the second substrate may be constituted by a silicon semiconductor substrate, a high strain point glass substrate, a soda glass ($Na_2O.CaO.SiO_2$) substrate, a borosilicate glass ($Na_2O.B_2O_3.SiO_2$) substrate, a forsterite ($2MgO.SiO_2$) substrate, a lead glass ($Na_2O.PbO.SiO_2$) substrate, various glass substrates each having an insulation material layer formed on a surface thereof, a quartz substrate, a quartz substrate having an insulation material layer formed on a surface thereof, or an organic polymer such as polymethyl methacrylate (PMMA), polyvinyl alcohol (PVA), polyvinyl phenol (PVP), polyether sulfone (PES), polyimide, polycarbonate, or polyethylene terephthalate (PET) (having a mode of a polymer material such as a plastic film, a plastic sheet, or a plastic substrate constituted by a polymer material and having flexibility). Materials constituting the first substrate and the second substrate may be the same as or different from each other. However, in the top emission type display device, the second substrate is required to be transparent to light from a light emitting element. In the bottom emission type display device, the first substrate is required to be transparent to light from a light emitting element.

In a case where the first electrode is caused to function as an anode electrode in the top emission type display device, examples of a material constituting the first electrode include a metal having high work function, such as platinum (Pt), gold (Au), silver (Ag), chromium (Cr), tungsten (W), nickel (Ni), copper (Cu), iron (Fe), cobalt (Co), or tantalum (Ta), or an alloy thereof (for example, an Ag—Pd—Cu alloy containing silver as a main component and containing 0.3% by mass to 1% by mass of palladium (Pd) and 0.3% by mass to 1% by mass of copper (Cu) or an Al—Nd alloy). Furthermore, in a case of using a conductive material having a small work function value and high light reflectivity, such as aluminum (Al) or an alloy containing aluminum, by improving a hole injection property, for example, by disposing an appropriate hole injection layer, the conductive material can be used as an anode electrode. The thickness of the first electrode may be 0.1 μm to 1 μm, for example. Alternatively, examples of a material constituting the first electrode further include various transparent conductive materials such as a transparent conductive material including, for a base layer, indium oxide, indium-tin oxide (ITO, including Sn-doped $In_2O_3$, crystalline ITO, and amorphous ITO), indium zinc oxide (IZO), indium-gallium oxide (IGO), indium-doped gallium-zinc oxide (IGZO, In—$GaZnO_4$), IFO (F-doped $In_2O_3$), ITiO (Ti-doped $In_2O_3$), InSn, InSnZnO, tin oxide ($SnO_2$), ATO (Sb-doped $SnO_2$), FTO (F-doped $SnO_2$), zinc oxide (ZnO), aluminum oxide-doped zinc oxide (AZO), gallium-doped zinc oxide (GZO), B-doped ZnO, AlMgZnO (aluminum oxide and magnesium oxide-doped zinc oxide), antimony oxide, titanium oxide, NiO, spinel type oxide, oxide having a $YbFe_2O_4$ structure, gallium oxide, titanium oxide, niobium oxide, nickel oxide, or the like. Alternatively, the first electrode may have a structure obtained by laminating a transparent conductive material having excellent hole injection characteristics, such as an oxide of indium and tin (ITO) or an oxide of indium and zinc (IZO) on a dielectric multilayer film or a reflective film having high light reflectivity, including aluminum (Al) or the like. Meanwhile, in a case where the first electrode is caused to function as a cathode electrode, the first electrode is desirably constituted by a conductive material having a small work function value and high light reflectivity. However, by improving an electron injection property, for example, by disposing an appropriate electron injection layer in a conductive material having high light reflectivity used as an anode electrode, the conductive material can also be used as a cathode electrode.

In a case where the second electrode is caused to function as a cathode electrode, a material constituting the second electrode (a semi-light transmitting material or a light transmitting material) is desirably constituted by a conductive material having a small work function value so as to be able to transmit emitted light and inject an electron into an organic layer efficiently. Examples of the material constituting the second electrode include a metal having a small work function and an alloy thereof, such as aluminum (Al), silver (Ag), magnesium (Mg), calcium (Ca), sodium (Na), strontium (Sr), an alkali metal or an alkaline earth metal and silver (Ag) [for example, an alloy of magnesium (Mg) and silver (Ag) (Mg—Ag alloy)], an alloy of magnesium-calcium (Mg—Ca alloy), or an alloy of aluminum (Al) and lithium (Li) (Al—Li alloy). Among these materials, an Mg—Ag alloy is preferable, and a volume ratio between magnesium and silver may be Mg:Ag=5:1 to 30:1, for example. Alternatively, as a volume ratio between magnesium and calcium may be Mg:Ca=2:1 to 10:1, for example. The thickness of the second electrode may be 4 nm to 50 nm, preferably 4 nm to 20 nm, and more preferably 6 nm to 12 nm, for example. Alternatively, the second electrode may have a laminated structure constituted by, from the organic layer side, the above material layer and a so-called transparent electrode (for example, thickness $3 \times 10^{-8}$ m to $1 \times 10^{-6}$ m) including, for example, ITO or IZO. A bus electrode (auxiliary electrode) including a low resistance material such as aluminum, an aluminum alloy, silver, a silver alloy, copper, a copper alloy, gold, or a gold alloy may be disposed in the second electrode to reduce resistance as the whole second electrode. Average light transmittance of the second electrode is 50% to 90%, and preferably 60% to 90%. The common electrode only needs to be constituted by a so-called transparent electrode including, for example, ITO or IZO. Meanwhile, in a case where the second electrode is caused to function as an anode electrode, the second electrode is desirably constituted by a conductive material that transmits emitted light and has a large work function value.

Examples of a method for forming the first electrode, the second electrode, or the common electrode include a combination of a vapor deposition method including an electron beam vapor deposition method, a hot filament vapor deposition method, and a vacuum vapor deposition method, a sputtering method, a chemical vapor deposition method (CVD method), an MOCVD method, and an ion plating method with an etching method; various printing methods such as a screen printing method, an inkjet printing method, and a metal mask printing method; a plating method (an electroplating method or an electroless plating method); a lift-off method; a laser ablation method; a sol-gel method; and the like. According to the various printing methods and the plating method, the first electrode or the second electrode having a desired shape (pattern) can be formed directly. Note that, in a case where the second electrode is formed after the organic layer is formed, the second electrode is preferably formed particularly on the basis of a film formation method in which energy of film formation particles is small, such as a vacuum vapor deposition method, or a film formation method such as an MOCVD method from a viewpoint of preventing the organic layer from being damaged. When the organic layer is damaged, non-light emitting pixels (or non-light emitting sub-pixels) called "dark spots" due to generation of a leak current may be generated.

The organic layer includes a light emitting layer containing an organic light emitting material. Specifically, for example, the organic layer may be constituted by a laminated structure of a hole transport layer, a light emitting layer, and an electron transport layer, a laminated structure of a hole transport layer and a light emitting layer serving also as an electron transport layer, a laminated structure of a hole injection layer, a hole transport layer, a light emitting layer, an electron transport layer, and an electron injection layer, or the like. Examples of a method for forming the organic layer include a physical vapor deposition method (PVD method) such as a vacuum vapor deposition method; a printing method such as a screen printing method or an inkjet printing method; a laser transfer method in which an organic layer on a laser absorption layer is separated by irradiating a laminated structure of the laser absorption layer and the organic layer formed on a transfer substrate with a laser and the organic layer is transferred; and various coating methods. In a case where the organic layer is formed on the basis of the vacuum vapor deposition method, for example, using a so-called metal mask, the organic layer can be obtained by depositing a material that has passed through an opening disposed in the metal mask.

As described above, an insulating protective film is preferably disposed on the second electrode in order to prevent moisture from reaching the organic layer. The protective film is preferably formed particularly on the basis of a film formation method in which the energy of film formation particles is small, such as a vacuum vapor deposition method, or a film formation method such as a CVD method or an MOCVD method because an influence on a base can be reduced. Alternatively, in order to prevent reduction in brightness due to deterioration of the organic layer, a film formation temperature is desirably set to room temperature. Furthermore, in order to prevent peeling of the protective film, the protective film is desirably formed under a condition minimizing a stress of the protective film. Furthermore, the protective film is desirably constituted by a material that transmits light generated in the organic layer by, for example, 80% or more. Specific examples of the material include an inorganic amorphous insulating material such as the following materials. Such an inorganic amorphous insulating material does not generate grains, and therefore has low water permeability and constitutes a good protective film. Specifically, as a material constituting the protective film, a material that is transparent to light emitted from the light emitting layer, is dense, and does not transmit moisture is preferably used. More specific examples of the material include $SiN_x$ containing amorphous silicon nitride ($\alpha$-$Si_{1-x}N_x$), $SiO_y$ containing amorphous silicon oxide ($\alpha$-$Si_{1-y}O_y$), SiON containing amorphous silicon oxide/nitride ($\alpha$-SiON), amorphous silicon ($\alpha$-Si), amorphous silicon carbide ($\alpha$-SiC), and $Al_2O_3$. In a case where a void is present immediately below the edge portion of the second electrode protruding from the end face of the organic layer, the protective film may be constituted by a transparent conductive material such as ITO or IZO. The protective film and the second substrate are bonded to each other, for example, via a resin layer (sealing resin layer). Examples of a material constituting the resin layer (sealing resin layer) include a thermosetting adhesive such as an acrylic adhesive, an epoxy-based adhesive, a urethane-based adhesive, a silicone-based adhesive, or a cyanoacrylate-based adhesive, and an ultraviolet curable adhesive.

A light shielding layer may be disposed between a light emitting element and a light emitting element. Specific examples of a light shielding material constituting the light shielding layer include a material capable of shielding light, such as titanium (Ti), chromium (Cr), tungsten (W), tantalum (Ta), aluminum (Al), or $MoSi_2$. The light shielding layer can be formed by a vapor deposition method including an electron beam vapor deposition method, a hot filament vapor deposition method, and a vacuum vapor deposition method, a sputtering method, a CVD method, an ion plating method, or the like.

On an outermost surface that emits light in the display device, an ultraviolet absorbing layer, a contamination preventing layer, a hard coat layer, and an antistatic layer may be formed, or a protective member (for example, cover glass) may be disposed.

In the display device of the present disclosure, examples of an insulating material constituting the insulation layer or the base body (interlayer insulation layer) include a $SiO_x$-based material (material constituting a silicon-based oxide film) such as $SiO_2$, non-doped silicate glass (NSG), borophosphosilicate glass (BPSG), PSG, BSG, AsSG, SbSG, PbSG, spin on glass (SOG), low temperature oxide (LTO, low temperature CVD-$SiO_2$), low melting point glass, or glass paste; a SiN-based material including a SiON-based material; SiOC; SiOF; and SiCN. Alternatively, examples of the insulating material further include an inorganic insulating material such as titanium oxide ($TiO_2$), tantalum oxide ($Ta_2O_5$), aluminum oxide ($Al_2O_3$), magnesium oxide (MgO), chromium oxide ($CrO_x$), zirconium oxide ($ZrO_2$), niobium oxide ($Nb_2O_5$), tin oxide ($SnO_2$), or vanadium oxide ($VO_x$). Alternatively, examples of the insulating material further include various resins such as a polyimide-based resin, an epoxy-based resin, and an acrylic resin; and a low dielectric constant insulating material such as SiOCH, organic SOG, or a fluorine-based resin (for example, a material having a dielectric constant k ($=\varepsilon/\varepsilon_0$) of 3.5 or less, for example, and specific examples thereof include fluorocarbon, cycloperfluorocarbon polymer, benzocyclobutene, cyclic fluororesin, polytetrafluoroethylene, amorphous tetrafluoroethylene, polyaryl ether, fluorinated aryl ether, fluorinated polyimide, amorphous carbon, parylene (polyparaxylylene), and fluorinated fullerene). Examples of the insulating material further include Silk (trademark of The Dow Chemical Co., coating type low dielectric constant interlayer insulation film material) and Flare (trademark of Honeywell Electronic Materials Co., polyallyl ether (PAE)-based material). In addition, these materials can be used singly or in appropriate combination thereof. The insulation layer or the base body (interlayer insulation layer) can be formed by a known method such as various CVD methods, various coating methods, various PVD methods including a sputtering method and a vacuum vapor deposition method, various printing methods such as a screen printing method, a plating method, an electrodeposition method, an immersion method, or a sol-gel method.

In order to further improve a light extraction efficiency, the organic EL display device preferably has a resonator structure. Specifically, light emitted from the light emitting layer is caused to resonate between a first interface constituted by an interface between the first electrode and the organic layer (or a first interface constituted by an interface between a light reflecting layer disposed below the first electrode and a portion of the interlayer insulation layer positioned above the light reflecting layer) and a second interface constituted by an interface between the second electrode and the organic layer, and a part of the light is emitted from the second electrode. In addition, if a distance from a maximum emission position of the light emitting layer to the first interface is represented by $L_1$, an optical distance thereof is represented by $OL_1$, a distance from the maximum emission position of the light emitting layer to the second interface is represented by $L_2$, an optical distance thereof is represented by $OL_2$, and $m_1$ and $m_2$ each represent an integer, the following formulas (1-1), (1-2), (1-3), and (1-4) are satisfied.

$$0.7\{-\Phi_1/(2\pi)+m_1\} \leq 2\times OL_1/\lambda \leq 1.2\{-\Phi_1/(2\pi)+m_1\} \quad (1\text{-}1)$$

$$0.7\{-\Phi_2/(2\pi)+m_2\} \leq 2\times OL_2/\lambda \leq 1.2\{-\Phi_2/(2\pi)+m_2\} \quad (1\text{-}2)$$

$$L_1 < L_2 \quad (1\text{-}3)$$

$$m_1 < m_2 \quad (1\text{-}4)$$

Here, $\lambda$: Maximum peak wavelength of a spectrum of light generated in the light emitting layer (or a desired wavelength among wavelengths of light generated in the light emitting layer)

$\Phi_1$: Phase shift amount (unit: radian) of light reflected on the first interface Provided that $-2\pi < \Phi_1 \leq 0$ is satisfied.

$\Phi_2$: Phase shift amount (unit: radian) of light reflected on second interface Provided that $-2\pi < \Phi_2 \leq 0$ is satisfied.

Here, $m_1=0$ and $m_2=1$ that can maximize a light extraction efficiency can be satisfied.

Note that the distance $L_1$ from the maximum emission position of the light emitting layer to the first interface means an actual distance (physical distance) from the maximum emission position of the light emitting layer to the first interface, and the distance $L_2$ from the maximum emission position of the light emitting layer to the second interface means an actual distance (physical distance) from the maximum emission position of the light emitting layer to the second interface. Furthermore, the optical distance is also called an optical path length, and generally means n×L when a light ray passes through a medium having a refractive index n for a distance L. The same applies to the following description. Therefore, if an average refractive index is represented by $n_{ave}$, the following relations are satisfied.

$$OL_1 = L_1 \times n_{ave}$$

$OL_2=L_2 \times n_{ave}$ Here, the average refractive index $n_{ave}$ is obtained by summing up a product of the refractive index and the thickness of each layer constituting the organic layer (or the organic layer and the interlayer insulation layer), and dividing the resulting sum by the thickness of the organic layer (or the organic layer and the interlayer insulation layer).

The first electrode or the light reflecting layer and the second electrode absorb a part of incident light and reflect the rest. Therefore, a phase shift occurs in the reflected light. The phase shift amounts $\Phi_1$ and $\Phi_2$ can be determined by measuring values of a real number part and an imaginary number part of a complex refractive index of a material constituting the first electrode or the light reflecting layer and the second electrode, for example, using an ellipsometer, and performing calculation based on these values (refer to, for example, "Principles of Optic", Max Born and Emil Wolf, 1974 (PERGAMON PRESS)). Note that the refractive index of the organic layer, the interlayer insulation layer, or the like can also be determined by measurement with an ellipsometer.

Examples of a material constituting the light reflecting layer include aluminum, an aluminum alloy (for example, Al—Nd or Al—Cu), an Al/Ti laminated structure, an Al—Cu/Ti laminated structure, chromium (Cr), silver (Ag), and a silver alloy (for example, Ag—Pd—Cu or Ag—Sm—Cu). The light reflecting layer can be formed, for example, by a vapor deposition method including an electron beam vapor deposition method, a hot filament vapor deposition method, and a vacuum vapor deposition method, a sputtering method, a CVD method, an ion plating method; a plating method (an electroplating method or an electroless plating method); a lift-off method; a laser ablation method; a sol-gel method; or the like.

As described above, in an organic EL display device having a resonator structure, actually, a red light emitting element constituted by inclusion of a red color filter in a white light emitting element causes red light emitted from the light emitting layer to resonate, and emits reddish light (light having a light spectrum peak in a red region) from the second electrode. Furthermore, the green light emitting element constituted by inclusion of a green color filter in a white light emitting element causes green light emitted from the light emitting layer to resonate, and emits greenish light (light having a light spectrum peak in a green region) from the second electrode. Furthermore, the blue light emitting element constituted by inclusion of a blue color filter in a white light emitting element causes blue light emitted from the light emitting layer to resonate, and emits blueish light (light having a light spectrum peak in a blue region) from the second electrode. In other words, it is only required to design each of the light emitting elements by determining a desired wavelength A (specifically, wavelengths of red light, green light, and blue light) among wavelengths of light generated in the light emitting layer and determining various parameters such as $OL_1$ and $OL_2$ in each of the red light emitting element, the green light emitting element, and the blue light emitting element on the basis of formulas (1-2), (1-2), (1-3), and (1-4). For example, paragraph [0041] of Japanese Patent Application Laid-Open No. 2012-216495 discloses an organic EL element having a resonator structure, using a light emitting layer (organic layer) as a resonance part, and describes that the film thickness of the organic layer is preferably 80 nm or more and 500 nm or less, and more preferably 150 nm or more and 350 nm or less because a distance from a light emitting point to a reflection surface can be appropriately adjusted.

In an organic EL display device, the thickness of a hole transport layer (hole supply layer) and the thickness of an electron transport layer (electron supply layer) are desirably substantially equal to each other. Alternatively, the thickness of the electron transport layer (electron supply layer) may be larger than that of the hole transport layer (hole supply layer). As a result, an electron can be supplied sufficiently to the light emitting layer in an amount necessary for a high efficiency at a low driving voltage. In other words, by disposing a hole transport layer between the first electrode corresponding to an anode electrode and the light emitting layer, and forming the hole transport layer with a film thickness smaller than that of the electron transport layer, supply of holes can be increased. In addition, this makes it possible to obtain a carrier balance with no excess or deficiency of holes and electrons and a sufficiently large carrier supply amount. Therefore, a high luminous efficiency can be obtained. Furthermore, due to no excess or deficiency of holes and electrons, the carrier balance hardly collapses, drive deterioration is suppressed, and an emission lifetime can be prolonged.

The display device can be used, for example, as a monitor device constituting a personal computer, or a monitor device incorporated in a television receiver, a mobile phone, a personal digital assistant (PDA), or a game machine. Alternatively, the display device can be applied to an electronic view finder (EVF) or a head mounted display (HMD). Alternatively, the display device can constitute an image display device in electronic paper such as an electronic book or electronic newspaper, a bulletin board such as a signboard, a poster, or a blackboard, rewritable paper substituted for printer paper, a display unit of a home appliance, a card display unit of a point card or the like, an electronic advertisement, or an electronic POP. The display device of the present disclosure can be used as a light emitting device, and can constitute various lighting devices including a backlight device for a liquid crystal display device and a planar light source device. The head mounted display includes: for example, (a) a frame mounted on the head of an observer; and
(b) an image display device attached to the frame.

The image display device includes:

(A) the display device of the present disclosure; and
(B) an optical device on which light emitted from the display device of the present disclosure is incident and from which the light is emitted.

The optical device includes:

(B-1) a light guide plate in which the light incident on the light guide plate from the display device of the present disclosure is propagated by total reflection and then the light is emitted from the light guide plate toward an observer;

(B-2) a first deflecting means (for example, including a volume hologram diffraction grating film) that deflects the light incident on the light guide plate such that the light incident on the light guide plate is totally reflected in the light guide plate; and (B-3) a second deflecting means (for example, including a volume hologram diffraction grating film) that deflects the light propagated in the light guide plate by total reflection a plurality of times in order to emit the light propagated in the light guide plate by total reflection from the light guide plate.

EXAMPLE 1

Figure 3A:
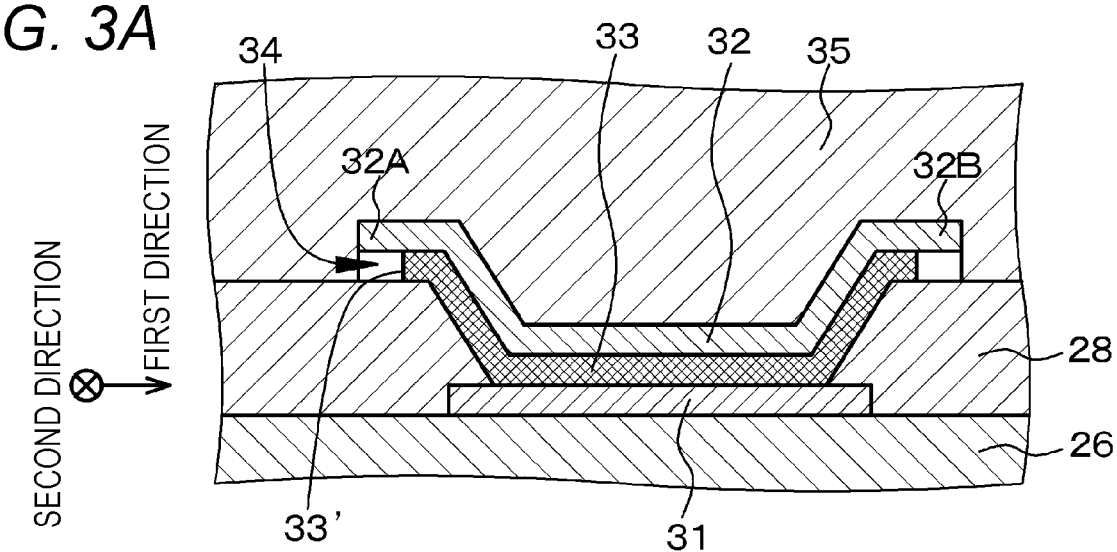
FIGS. 3A, 3B, and 3C are schematic partial end views of the light emitting element of Example 1.

Example 1 relates to the light emitting element of the present disclosure and the display device of the present disclosure, and specifically to the light emitting element according to the first embodiment of the present disclosure. FIG. 1 illustrates a schematic partial cross-sectional view of the display device of Example 1. FIG. 2 illustrates a schematic view of a part of the display device of Example 1 as viewed from above. FIG. 3A illustrates a schematic partial end view of the light emitting element of Example 1. The display device of Example 1 is specifically constituted by an organic EL display device. The light emitting element of Example 1 is specifically constituted by an organic EL element. Furthermore, the display device of Example 1 is a top emission type display device that emits light from the second substrate.

A light emitting element 10 of Example 1 includes:

a base body 26;
a first electrode 31 formed on the base body 26;
an organic layer 33 formed on the first electrode 31 and having at least a light emitting layer; and
a second electrode 32 formed on the organic layer 33.

The second electrode 32 has at least two edge portions opposed to each other, and each of the edge portions of the second electrode 32 protrudes from an end face 33' of the organic layer 33. The organic layer 33 is not present immediately below each of the edge portions of the second electrode 32.

Furthermore, the display device of Example 1 includes:

a first substrate 11; a second substrate 41; and
a plurality of light emitting elements 10R, 10G, and 10B positioned between the first substrate 11 and the second substrate 41 and arranged in a two-dimensional matrix.

Each of the light emitting elements 10R, 10G, and 10B includes:

the first electrode 31 formed on the base body 26 disposed on the first substrate 11;
the organic layer 33 formed on the first electrode 31 and having at least a light emitting layer; and
the second electrode 32 formed on the organic layer 33.

The second electrode 32 has at least two edge portions opposed to each other, and each of the edge portions of the second electrode 32 protrudes from the end face 33' of the organic layer 33.

Alternatively, the display device of Example 1 includes the first substrate 11, the second substrate 41, and an image display unit sandwiched by the first substrate 11 and the second substrate 41.

In the image display unit, the plurality of light emitting elements 10R, 10G, and 10B of Example 1 is arranged in a two-dimensional matrix. Here, the light emitting elements 10R, 10G, and 10B are formed on a side of the first substrate 11.

One pixel is constituted by three light emitting elements of the red light emitting element 10R, the green light emitting element 10G, and the blue light emitting element 10B. The second substrate 41 includes color filters $CF_R$, $CF_G$, and $CF_B$. In other words, the organic EL element emits white light, and the light emitting elements 10R, 10G, and 10B are constituted by a combination of a white light emitting element that emits white light and the color filters $CF_R$, $CF_G$, and $CF_B$, respectively. The light emitting layer emits white light as a whole. Furthermore, a black matrix layer BM is disposed between a color filter and a color filter. For example, the black matrix layer BM is constituted by a black resin film (specifically, for example, a black polyimide resin) having an optical density of 1 or more, mixed with a black coloring agent. The number of pixels is, for example, 1920×1080. One light emitting element (display element)

constitutes one sub-pixel, and the number of light emitting elements (specifically, organic EL elements) is three times the number of pixels.

In the display device of Example 1, examples of an arrangement of sub-pixels include a stripe arrangement.

In addition, the second electrode 32 is isolated at a portion between light emitting elements adjacent in a first direction, the second electrode 32 is common to light emitting elements adjacent in a second direction different from the first direction, the second electrode 32 has two edge portions 32A and 32B opposed to each other, and the two edge portions 32A and 32B opposed to each other extend in the second direction. Here, the organic layer 33 continuously extends in the second direction and is isolated at a portion between the light emitting element 10 and the light emitting element 10 in the first direction. The first direction is orthogonal to the second direction. Note that the organic layer 33 may be isolated at a portion between a light emitting element and a light emitting element in the second direction.

In the light emitting element of Example 1, as described above, the first electrode 31 is disposed for each light emitting element on the base body 26 including an interlayer insulation layer. In addition, an insulation layer 28 having an opening 29 in which the first electrode 31 is exposed to a bottom is formed on the base body 26, and the organic layer 33 is formed at least on the first electrode 31 exposed to the bottom of the opening 29. Specifically, the organic layer 33 is formed so as to cover a portion from the first electrode 31 exposed to the bottom of the opening 29 to a part of the insulation layer 28, and the insulation layer 28 is formed so as to cover a portion from the first electrode 31 to the base body 26. An actual light emitting portion of the organic layer 33 is surrounded by the insulation layer 28. The insulation layer 28 and the second electrode 32 are covered with a protective film 35 containing SiN. The protective film 35 and the second substrate 41 are bonded to each other over the entire surface with a sealing resin layer 36 containing an acrylic adhesive.

Figure 3B:
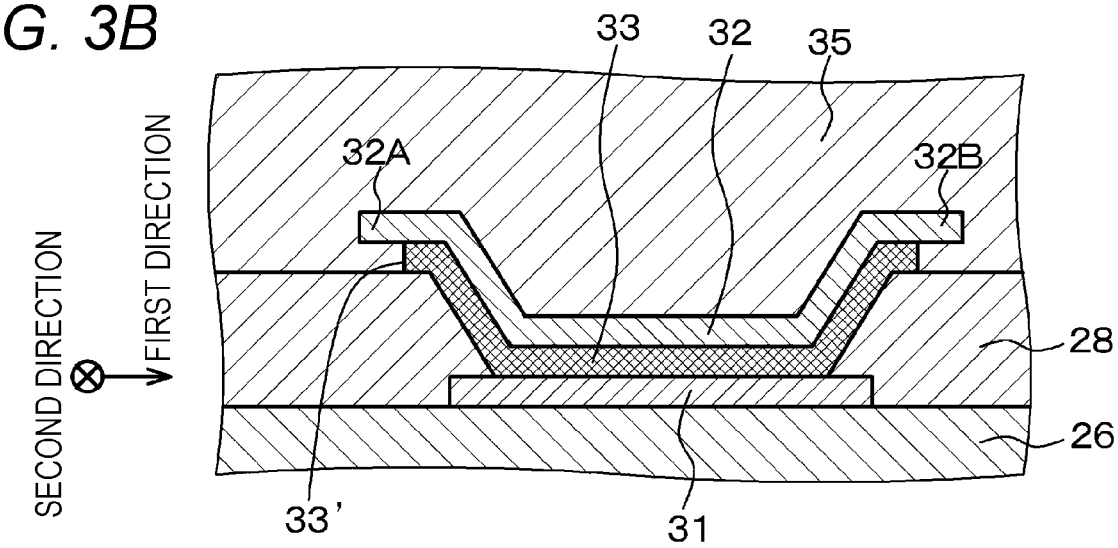
Figure 3C:
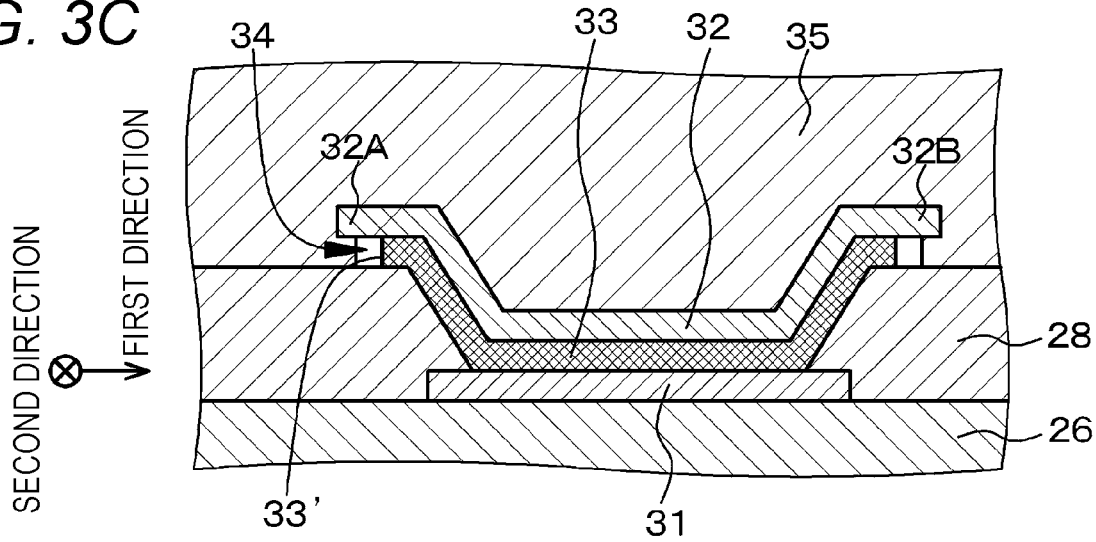

Here, as illustrated in the schematic partial end view in FIG. 3A, a void (electrically insulated portion) 34 is present immediately below each of the edge portions 32A and 32B of the second electrode 32 protruding from the end face 33' of the organic layer 33 (first mode). The width of the void 34 may be 0.1 µm to 10 µm, for example. Alternatively, as illustrated in the schematic partial end view in FIG. 3B, as described above, the protective film 35 covering the second electrode 32 is further included, and the protective film 35 extends immediately below each of the edge portions 32A and 32B of the second electrode 32 protruding from the end face 33' of the organic layer 33 (second mode). Alternatively, as illustrated in the schematic partial end view in FIG. 3C, as described above, the protective film 35 covering the second electrode 32 is further included, a void (electrically insulated portion) is present adjacent to the organic layer 33 in a part immediately below each of the edge portions 32A and 32B of the second electrode 32 protruding from the end face 33' of the organic layer 33, and the protective film 35 extends to another portion immediately below each of the edge portions 32A and 32B of the second electrode 32 protruding from an edge portion of the organic layer 33 (third mode).

A light emitting element driving unit is disposed below the base body (interlayer insulation layer) 26 including SiON and formed on the basis of a CVD method. The light emitting element driving unit may have a known circuit configuration. The light emitting element driving unit is constituted by a transistor (specifically, MOSFET) formed on a silicon semiconductor substrate corresponding to the first substrate 11. The transistor 20 constituted by MOSFET includes a gate insulation layer 22 formed on the first substrate 11, a gate electrode 21 formed on the gate insulation layer 22, a source/drain region 24 formed on the first substrate 11, a channel forming region 23 formed between the source/drain regions 24, and an element isolating region 25 surrounding the channel forming region 23 and the source/drain region 24. The transistor 20 is electrically connected to the first electrode 31 via a contact plug 27 disposed in the base body 26. Note that one transistor 20 is illustrated for one light emitting element driving unit in the drawings.

The second electrode 32 is connected to the light emitting element driving unit via a contact hole (contact plug) (not illustrated) formed in the base body (interlayer insulation layer) 26 at an outer periphery of the display device. Note that an auxiliary electrode connected to the second electrode 32 may be disposed below the second electrode 32 in the outer periphery of the display device, and the auxiliary electrode may be connected to the light emitting element driving unit.

The first electrode 31 functions as an anode electrode, and the second electrode 32 functions as a cathode electrode. The first electrode 31 includes a light reflecting material, specifically, an Al—Nd alloy. The second electrode 32 includes a transparent conductive material such as ITO. The first electrode 31 is formed on the basis of a combination of a vacuum vapor deposition method and an etching method. Furthermore, a film of the second electrode 32 is formed by a film formation method in which energy of film formation particles is small, such as a vacuum vapor deposition method, and is patterned in a band shape extending in the second direction. The organic layer 33 is also patterned in a band shape extending in the second direction. The first substrate 11 includes a silicon semiconductor substrate, and the second substrate 41 includes a glass substrate.

In Example 1, the organic layer 33 has a laminated structure of a hole injection layer (HIL), a hole transport layer (HTL), a light emitting layer, an electron transport layer (ETL), and an electron injection layer (EIL). The light emitting layer is constituted by at least two light emitting layers that emit different colors, and light emitted from the organic layer 33 is white. Specifically, the light emitting layer has a structure in which three layers of a red light emitting layer that emits red light, a green light emitting layer that emits green light, and a blue light emitting layer that emits blue light are laminated. The light emitting layer may have a structure in which two layers of a blue light emitting layer that emits blue light and a yellow light emitting layer that emits yellow light are laminated or a structure in which two layers of a blue light emitting layer that emits blue light and an orange light emitting layer that emits orange light are laminated. The red light emitting element 10R to display a red color includes the red color filter $CF_R$. The green light emitting element 10G to display a green color includes the green color filter $CF_G$. The blue light emitting element 10B to display a blue color includes the blue color filter $CF_B$. The red light emitting element 10R, the green light emitting element 10G, and the blue light emitting element 10B have the same configuration and structure except for the color filters and positions of the light emitting layers. The black matrix layer BM is formed between a color filter CF and a color filter CF. In addition, the color filter CF and the black matrix layer BM are formed on a surface side of the second substrate 41 opposed to the first substrate 11. This makes it possible to shorten a distance between the light emitting layer and the color filter CF and to suppress color mixing caused by incidence of light emitted from the light emitting layer on an adjacent color filter CF of another color.

The hole injection layer increases a hole injection efficiency, functions as a buffer layer for preventing leakage, and has a thickness of about 2 nm to 10 nm, for example. The hole injection layer includes a hexaazatriphenylene derivative represented by the following formula (A) or (B), for example. Note that contact of an end face of the hole injection layer with the second electrode becomes a main cause of occurrence of brightness variation among pixels, leading to deterioration in display image quality.

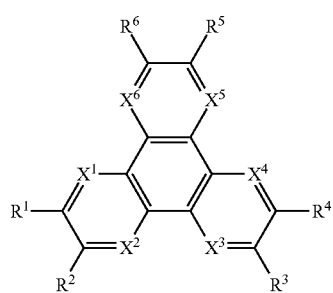

(A)

Here, $R^1$ to $R^6$ each independently represent a substituent selected from a hydrogen atom, a halogen atom, a hydroxy group, an amino group, an arulamino group, a substituted or unsubstituted carbonyl group having 20 or less carbon atoms, a substituted or unsubstituted carbonyl ester group having 20 or less carbon atoms, a substituted or unsubstituted alkyl group having 20 or less carbon atoms, a substituted or unsubstituted alkenyl group having 20 or less carbon atoms, a substituted or unsubstituted alkoxy group having 20 or less carbon atoms, a substituted or unsubstituted aryl group having 30 or less carbon atoms, a substituted or unsubstituted heterocyclic group having 30 or less carbon atoms, a nitrile group, a cyano group, a nitro group, and a silyl group, and adjacent Rms (m=1 to 6) may be bonded to each other via a cyclic structure. Furthermore, $X^1$ to $X^6$ each independently represent a carbon atom or a nitrogen atom.

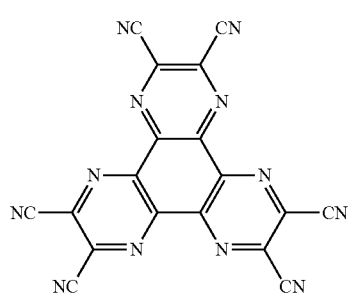

(B)

The hole transport layer is a layer that increases a hole transport efficiency to the light emitting layer. When an electric field is applied to the light emitting layer, recombination of electrons and holes occurs to generate light. The electron transport layer is a layer that increases an electron transport efficiency to the light emitting layer, and the electron injection layer is a layer that increases an electron injection efficiency to the light emitting layer.

The hole transport layer includes 4,4',4"-tris(3-methylphenylphenylamino) triphenylamine (m-MTDATA) or α-naphthylphenyl diamine (aNPD) having a thickness of about 40 nm, for example.

The light emitting layer is a light emitting layer that generates white light by color mixing, and is formed by laminating a red light emitting layer, a green light emitting layer, and a blue light emitting layer as described above, for example.

In the red light emitting layer, by application of an electric field, a part of holes injected from the first electrode 31 and a part of electrons injected from the second electrode 32 are recombined to generate red light. Such a red light emitting layer contains at least one kind of material among a red light emitting material, a hole transport material, an electron transport material, and a both charge transport material, for example. The red light emitting material may be a fluorescent material or a phosphorescent material. The red light emitting layer having a thickness of about 5 nm is formed by mixing 30% by mass of 2,6-bis[(4'-methoxydiphenylamino) styryl]-1,5-dicyanonaphthalene (BSN) with 4,4-bis(2,2-diphenylvinin) biphenyl (DPVBi), for example.

In the green light emitting layer, by application of an electric field, a part of holes injected from the first electrode 31 and a part of electrons injected from the second electrode 32 are recombined to generate green light. Such a green light emitting layer contains at least one kind of material among a green light emitting material, a hole transport material, an electron transport material, and a both charge transport material, for example. The green light emitting material may be a fluorescent material or a phosphorescent material. The green light emitting layer having a thickness of about 10 nm is formed by mixing 5% by mass of coumarin 6 with DPVBi, for example.

In the blue light emitting layer, by application of an electric field, a part of holes injected from the first electrode 31 and a part of electrons injected from the second electrode 32 are recombined to generate blue light. Such a blue light emitting layer contains at least one kind of material among a blue light emitting material, a hole transport material, an electron transport material, and a both charge transport material, for example. The blue light emitting material may be a fluorescent material or a phosphorescent material. The blue light emitting layer having a thickness of about 30 nm is formed by mixing 2.5% by mass of 4,4'-bis[2-{4-(N,N-diphenylamino) phenyl} vinyl] biphenyl (DPAVBi) with DPVBi, for example.

The electron transport layer having a thickness of about 20 nm includes 8-hydroxyquinoline aluminum (Alq3), for example. The electron injection layer having a thickness of about 0.3 nm includes LiF, $Li_2O$, or the like, for example.

However, the materials constituting the layers are illustrative, and are not limited to these materials. Furthermore, for example, the light emitting layer may be constituted by a blue light emitting layer and a yellow light emitting layer, or may be constituted by a blue light emitting layer and an orange light emitting layer.

The light emitting element has a resonator structure using the organic layer 33 as a resonance part. Note that the thickness of the organic layer 33 is preferably $8 \times 10^{-8}$ m or more and $5 \times 10^{-7}$ m or less, and more preferably $1.5 \times 10^{-7}$ m or more and $3.5 \times 10^{-7}$ m or less in order to appropriately adjust a distance from a light emitting surface to a reflecting surface (specifically, a distance from a light emitting surface to each of the first electrode 31 and the second electrode 32). In an organic EL display device having a resonator structure, actually, the red light emitting element 10R causes red light emitted from the light emitting layer to resonate, and emits reddish light (light having a light spectrum peak in a red region) from the second electrode 32. Furthermore, the green light emitting element 10G causes green light emitted from the light emitting layer to resonate, and emits greenish light (light having a light spectrum peak in a green region) from the second electrode 32. Furthermore, the blue light emitting element 10B causes blue light emitted from the light emitting layer to resonate, and emits bluish light (light having a light spectrum peak in a blue region) from the second electrode 32.

Hereinafter, with reference to FIGS. 7A, 7B, 7C, and 7D which are schematic partial cross-sectional views of a base body or the like, an outline of a method for manufacturing the light emitting element of Example 1 illustrated in FIG. 3A will be described.

[Step-100]

First, a light emitting element driving unit is formed on a silicon semiconductor substrate (first substrate 11) on the basis of a known MOSFET manufacturing process.

[Step-110]

Subsequently, the base body (interlayer insulation layer) 26 is formed on the entire surface on the basis of a CVD method.

[Step-120]

Next, in a portion of the base body 26 positioned above one of source/drain regions of the transistor 20, a connection hole is formed on the basis of a photolithography technique and an etching technique. Thereafter, a metal layer is formed on the base body 26 including the connection hole, for example, on the basis of a sputtering method. Subsequently, the metal layer is patterned on the basis of the photolithography technique and the etching technique, and the first electrode 31 can be thereby formed on the base body 26. The first electrode 31 is isolated for each of the light emitting elements. At the same time, the contact hole (contact plug) 27 for electrically connecting the first electrode 31 to the transistor 20 can be formed in the connection hole. Note that the contact hole (contact plug) 27 is not illustrated in FIGS. 7A, 7B, 7C, 7D, and FIGS. 8A, 8B, 8C, 9A, 9B, and 9C described later.

[Step-130]

Next, the insulation layer 28 is formed on the entire surface, for example, on the basis of a CVD method. Thereafter, the opening 29 is formed in a part of the insulation layer 28 on the first electrode 31 on the basis of the photolithography technique and the etching technique. The first electrode 31 is exposed to a bottom of the opening 29.

[Step-140]

Thereafter, a film of the organic layer 33 is formed on the first electrode 31 and the insulation layer 28, for example, by a PVD method such as a vacuum vapor deposition method or a sputtering method, a coating method such as a spin coating method or a die coating method, or the like, and then the organic layer 33 is patterned into a desired shape. Note that the patterned organic layer 33 can also be formed on the first electrode 31 and the insulation layer 28. In this way, the structure illustrated in FIG. 7A can be obtained.

[Step-150]

Figure 7A:
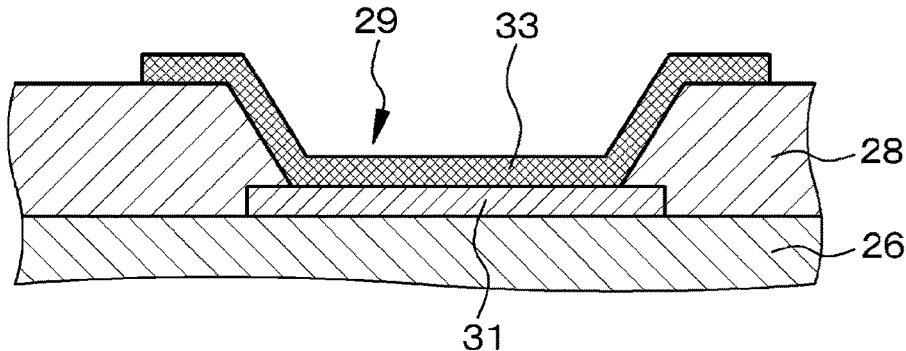
FIGS. 7A, 7B, 7C, and 7D are schematic partial cross-sectional views of a base body or the like for explaining a method for manufacturing the light emitting element of Example 1 illustrated in FIG. 3A.
Figure 7B:
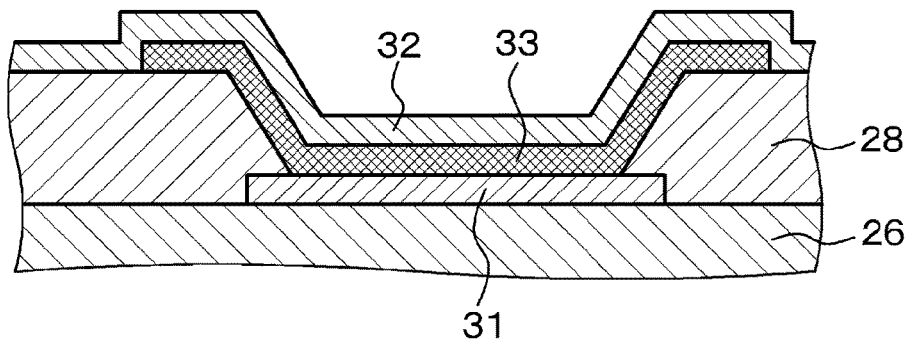
Figure 7C:
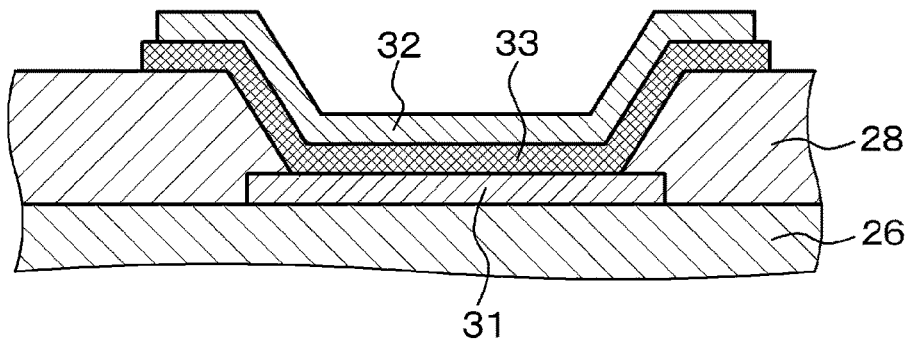
Figure 7D:
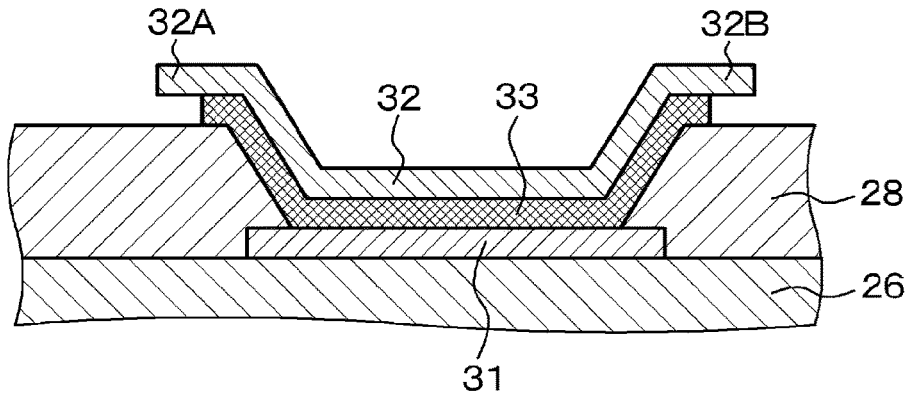

Subsequently, the second electrode 32 is formed on the entire surface, for example, on the basis of a vacuum vapor deposition method or the like (refer to FIG. 7B), and then the second electrode is patterned into a desired shape (refer to FIG. 7C). In this way, the organic layer 33 and the second electrode 32 can be formed on the first electrode 31. The organic layer 33 and the second electrode 32 extend in the second direction in a band shape and are common to light emitting elements arranged in the second direction.

[Step-160]

Next, the organic layer 33 is isotropically etched using the second electrode 32 as an etching mask. As an etching method, a dry etching method or a wet etching method may be used. In addition, as a result, it is possible to obtain a state in which each of the edge portions 32A and 32B of the second electrode 32 protrudes from the end face 33' of the organic layer 33 (refer to FIG. 7D). The organic layer 33 is not present immediately below each of the edge portions 32A and 32B of the second electrode 32.

[Step-170]

Thereafter, the protective film 35 is formed on the entire surface, for example, by a CVD method or a PVD method. Finally, the protective film 35 and the second substrate 41 are bonded to each other via the resin layer (sealing resin layer) 36. Note that the color filters $CF_R$, $CF_G$, and $CF_B$, and the black matrix layer BM are formed in advance on the second substrate 41. Then, a surface on which the color filter CF is formed is used as a bonding surface. In this way, the organic EL display device illustrated in FIG. 1 can be obtained.

In the light emitting of Example 1 or the light emitting element constituting the display device of Example 1, the edge portion of the second electrode protrudes from the end face of the organic layer. In other words, no organic layer is present immediately below the edge portion of the second electrode, and the second electrode is not in direct contact with the end face of the organic layer. Therefore, a current flows between a top face of the organic layer and the second electrode, but flowing of a current (leak current) between an end face of the organic layer (particularly an end face of the hole injection layer) and the second electrode can be suppressed. As a result, occurrence of brightness variation can be prevented, and display image quality is not deteriorated. In addition, in a step of providing such a configuration and structure, the organic layer is not damaged. In addition, the organic layer is isotropically patterned by dry etching or wet etching using the second electrode as an etching mask. However, a void can be formed by controlling a side-etching amount. Therefore, a dedicated step for making the edge portion of the second electrode protrude from the end face of the organic layer is not necessary, and it is possible to simplify a process and to reduce cost of the process.

EXAMPLE 2

Example 2 is a modification of Example 1.

Figure 4A:
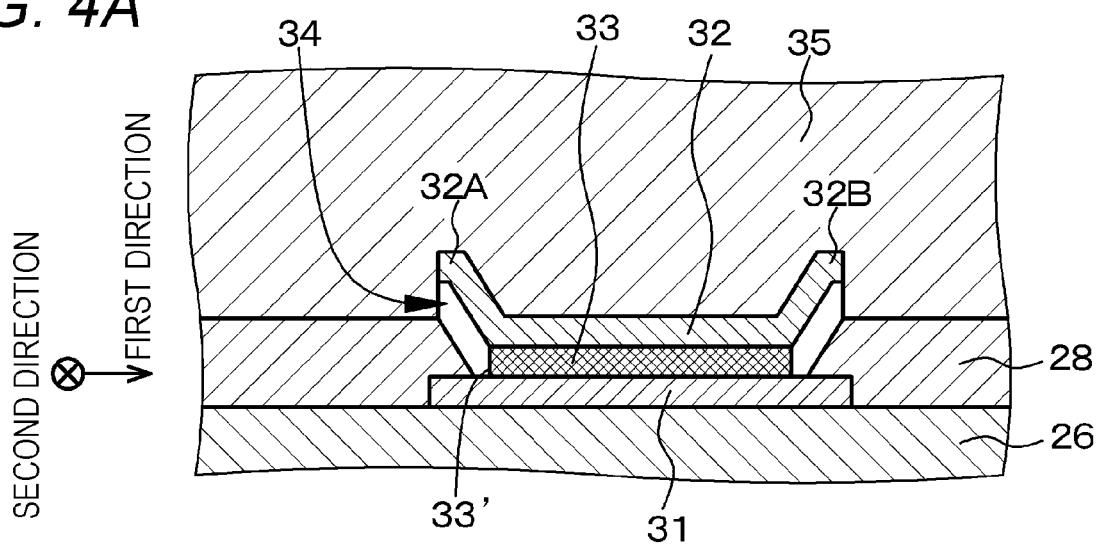
FIGS. 4A, 4B, and 4C are schematic partial cross-sectional views of a light emitting element of Example 2.

In a light emitting element of Example 2, illustrating a schematic partial cross-sectional view in FIG. 4A, the organic layer 33 is disposed at a bottom of the opening 29 formed in the insulation layer 28. In addition, as in Example 1, each of the edge portions 32A and 32B of the second electrode 32 protrudes from the end face 33' of the organic layer 33. The organic layer 33 is not present immediately below each of the edge portions 32A and 32B of the second electrode 32.

Figure 8A:
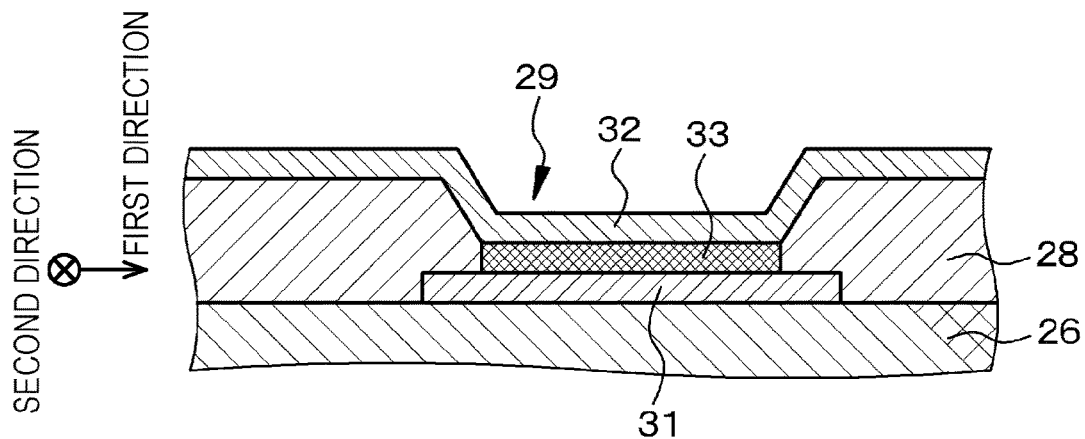
FIGS. 8A, 8B, and 8C are schematic partial cross-sectional views of a base body or the like for explaining a method for manufacturing the light emitting element of Example 2 illustrated in FIG. 4A.
Figure 8B:
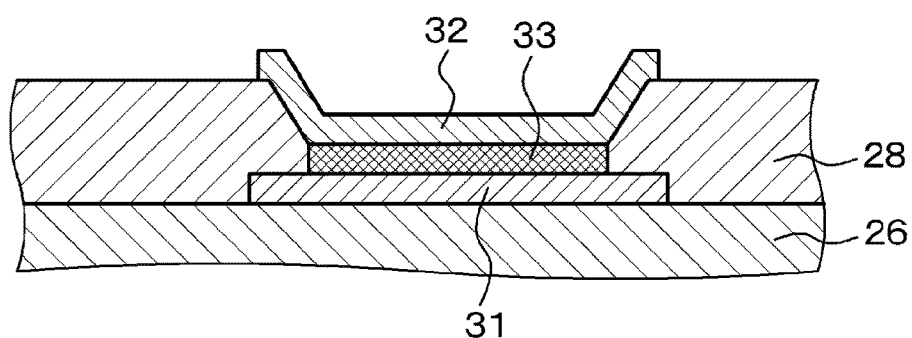
Figure 8C:
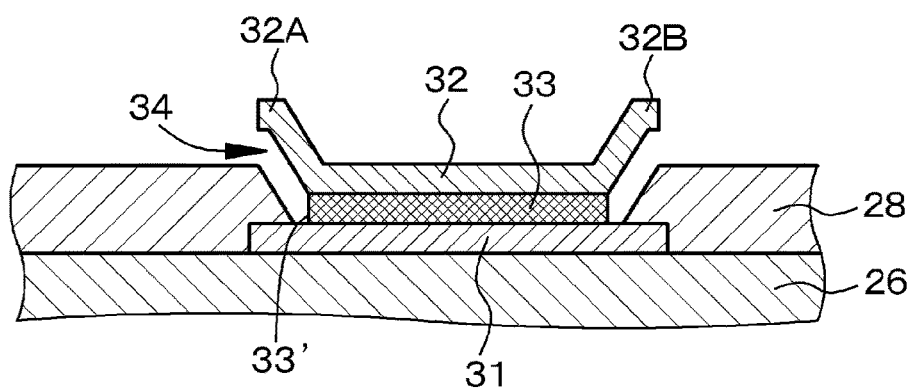

Hereinafter, with reference to FIGS. 8A, 8B, and 8C which are schematic partial cross-sectional views of a base body or the like, an outline of a method for manufacturing the light emitting element of Example 2 illustrated in FIG. 4A will be described.

[Step-200-A]

First, [step-100] to [step-130] in Example 1 are executed. Thereafter, a film of the organic layer 33 is formed on the first electrode 31 and the insulation layer 28, for example, by a PVD method such as a vacuum vapor deposition method or a sputtering method, a coating method such as a spin coating method or a die coating method, or the like, and then the organic layer 33 is patterned into a desired shape to dispose the organic layer 33 at a bottom of the opening 29 formed in the insulation layer 28.

[Step 210-A]

Subsequently, the second electrode 32 is formed on the entire surface, for example, on the basis of a vacuum vapor deposition method or the like (refer to FIG. 8A), and the second electrode is patterned into a desired shape (refer to FIG. 8B). In this way, the organic layer 33 and the second electrode 32 can be formed on the first electrode 31. The second electrode 32 extends in the second direction in a band shape and is common to light emitting elements arranged in the second direction. Furthermore, the organic layer 33 is isolated at a portion between a light emitting element and a light emitting element in the first direction, and is common to light emitting elements arranged in the second direction.

[Step 220-A]

Next, the insulation layer 28 is etched using the second electrode 32 as an etching mask. As a result, it is possible to obtain a state in which each of the edge portions 32A and 32B of the second electrode 32 protrudes from the end face 33' of the organic layer 33 (refer to FIG. 8C). The organic layer 33 is not present immediately below each of the edge portions 32A and 32B of the second electrode 32.

[Step-230-A]

Thereafter, by executing a similar step to [step-170] in Example 1, an organic EL display device including the light emitting element illustrated in FIG. 4A can be obtained.

Figure 4B:
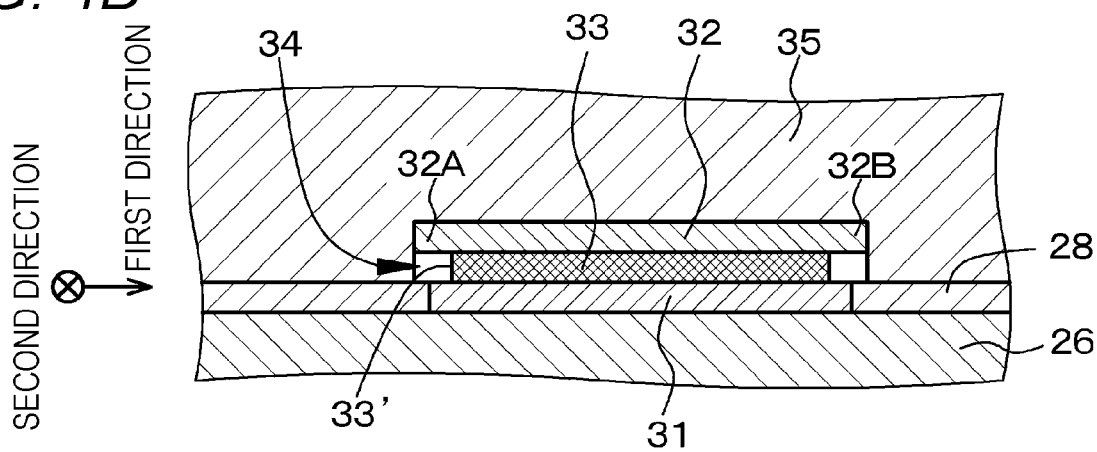

Alternatively, the light emitting element of Example 2, illustrating a schematic partial cross-sectional view in FIG. 4B, further includes the insulation layer 28 formed on the base body 26 and formed so as to surround the first electrode 31. In addition, as in Example 1, each of the edge portions 32A and 32B of the second electrode 32 protrudes from the end face 33' of the organic layer 33. The organic layer 33 is not present immediately below each of the edge portions 32A and 32B of the second electrode 32.

Figure 9A:
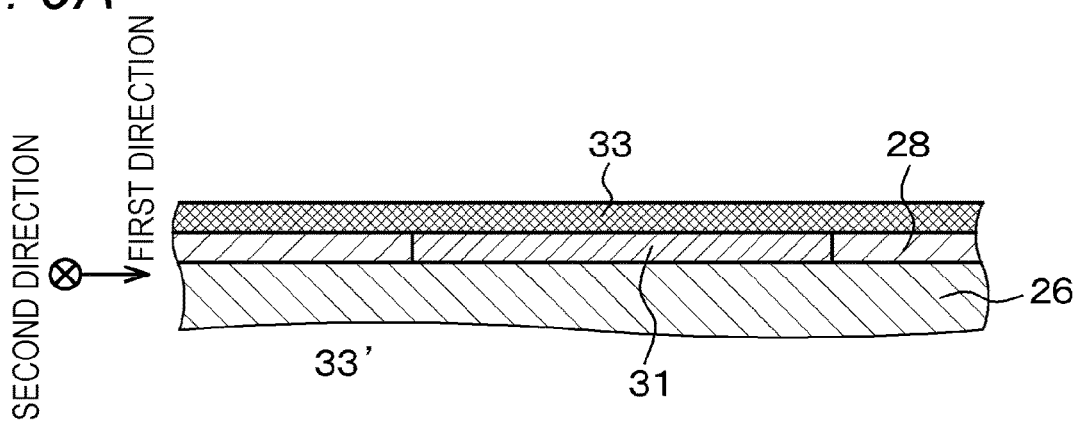
FIGS. 9A, 9B, and 9C are schematic partial cross-sectional views of a base body or the like for explaining a method for manufacturing the light emitting element of Example 2 illustrated in FIG. 4B.
Figure 9B:
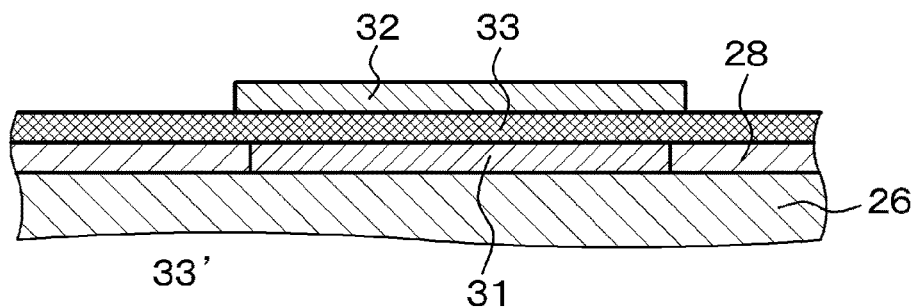
Figure 9C:
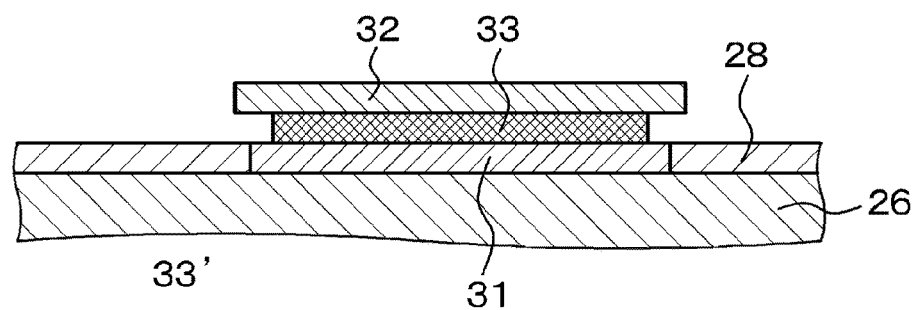

Hereinafter, with reference to FIGS. 9A, 9B, and 9C which are schematic partial cross-sectional views of a base body or the like, an outline of a method for manufacturing the light emitting element of Example 2, illustrated in FIG. 4B, will be described.

[Step-200-B]

First, [step-100] to [step-120] in Example 1 are executed. Unlike Example 1, the insulation layer 28 is formed on the base body 26 and is formed so as to surround the first electrode 31.

[Step 210-B]

Thereafter, a film of the organic layer 33 is formed on the first electrode 31 and the insulation layer 28 by a PVD method such as a vacuum vapor deposition method or a sputtering method, a coating method such as a spin coating method or a die coating method, or the like (refer to FIG. 9A), for example. Subsequently, the second electrode 32 is formed on the organic layer 33, and is patterned into a desired shape (refer to FIG. 9B). In this way, the organic layer 33 and the second electrode 32 can be formed on the first electrode 31. The second electrode 32 extends in the second direction in a band shape and is common to light emitting elements arranged in the second direction. Furthermore, the organic layer 33 is isolated at a portion between a light emitting element and a light emitting element in the first direction, and is common to light emitting elements arranged in the second direction.

[Step 220-B]

Next, the insulation layer 28 is etched using the second electrode 32 as an etching mask. As a result, it is possible to obtain a state in which each of the edge portions 32A and 32B of the second electrode 32 protrudes from the end face 33' of the organic layer 33 (refer to FIG. 9C). The organic layer 33 is not present immediately below each of the edge portions 32A and 32B of the second electrode 32.

[Step-230-B]

Thereafter, by executing a similar step to [step-170] in Example 1, an organic EL display device including the light emitting element illustrated in FIG. 4B can be obtained.

Figure 4C:
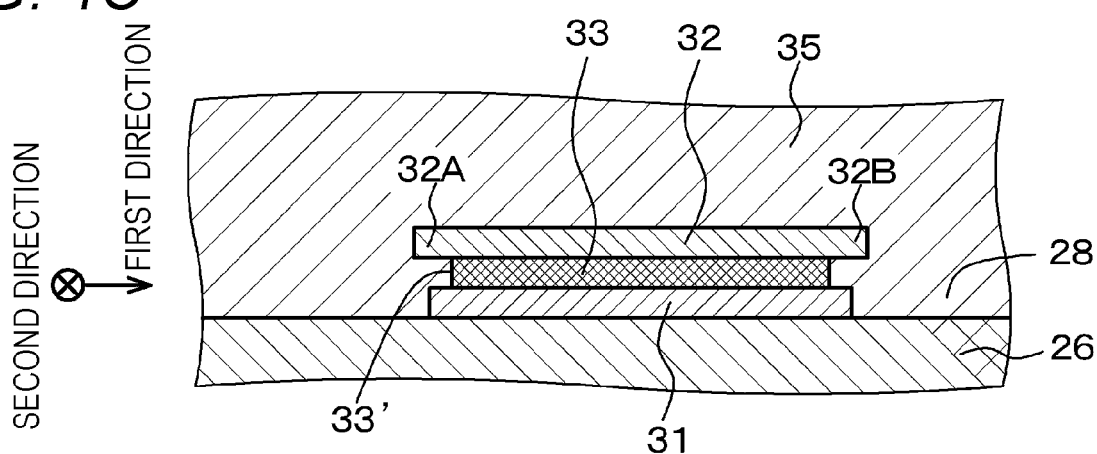

By removing the insulation layer 28 after [step-220-B], a light emitting element having the structure illustrated in FIG. 4C can be obtained finally.

EXAMPLE 3

Figure 6:
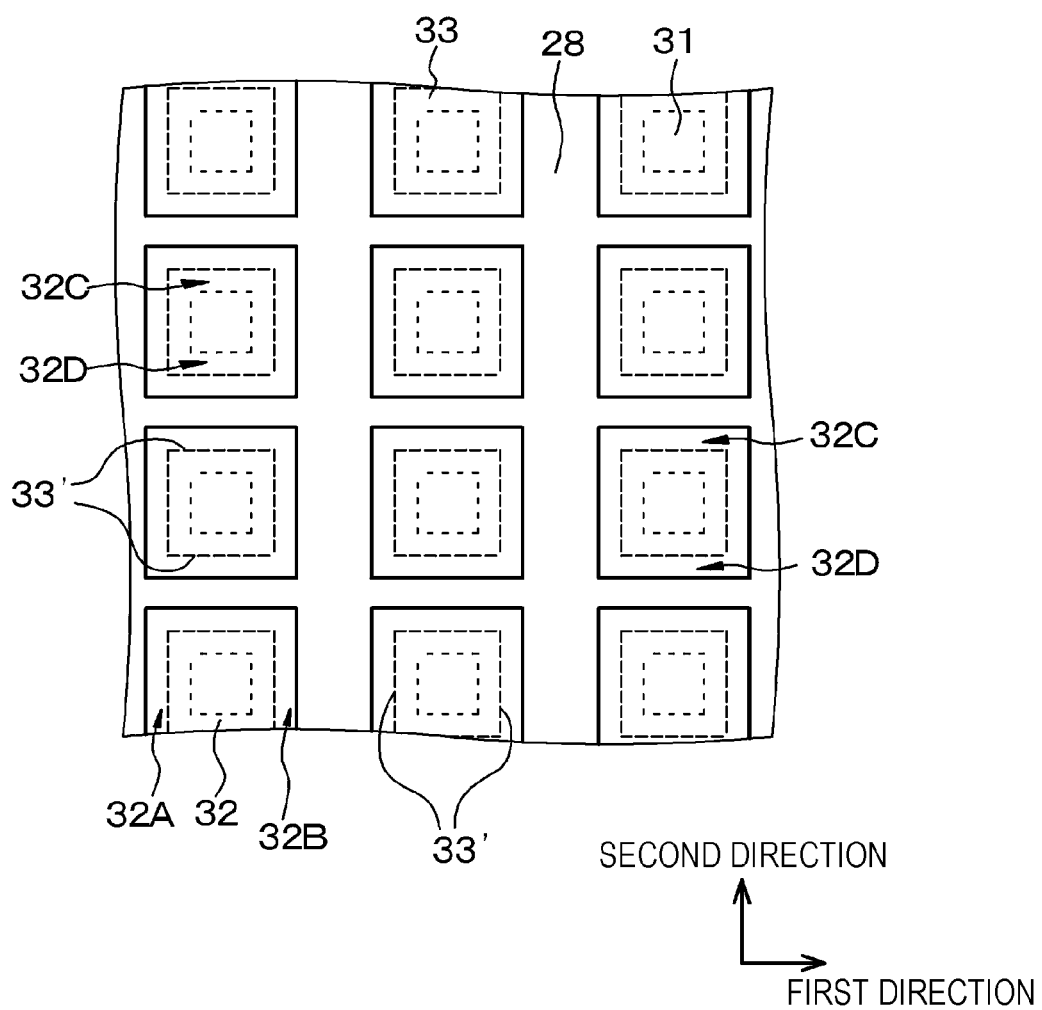
FIG. 6 is a schematic view of a part of the display device of Example 3 as viewed from above.

Example 3 is a modification of Examples 1 and 2, and relates to a light emitting element according to the second embodiment of the present disclosure. FIG. 5 illustrates a schematic partial cross-sectional view of the display device of Example 3. FIG. 6 illustrates a schematic view of a part of the display device of Example 2 as viewed from above.

In the light emitting element 10 of Example 3, the second electrode 32 is isolated at a portion between light emitting elements adjacent in a first direction, and is isolated at a portion between light emitting elements adjacent in a second direction different from the first direction, the second electrode 32 has the four edge portions 32A, 32B, 32C, and 32D opposed to one another, the two edge portions 32C and 32D opposed to each other extend in the first direction, and the remaining two edge portions 32A and 32B opposed to each other extend in the second direction. Here, the organic layer 33 is isolated at a portion between the light emitting element 10 and the light emitting element 10 in the second direction, and is also isolated at a portion between the light emitting element 10 and the light emitting element 10 in the first direction. In addition, a common electrode (so-called solid electrode) 37 common to adjacent light emitting elements is formed on the second electrode 32. The first direction is orthogonal to the second direction. Note that the organic layer 33 does not have to be isolated at a portion between a light emitting element and a light emitting element in the second direction.

In the light emitting element of Example 3, examples of an arrangement of pixels include a stripe arrangement, a diagonal arrangement, a delta arrangement, a stripe arrangement, a rectangle arrangement and a pentile arrangement.

The light emitting element of Example 3 can be obtained by forming the second electrode 32 isolated for each light emitting element in the method for manufacturing a light emitting element described in Example 1, and then forming the common electrode (so-called solid electrode) 37 common to adjacent light emitting elements on the second electrode 32.

Hitherto, the present disclosure has been described on the basis of the preferable Examples. However, the present disclosure is not limited to these Examples. The configurations and structures of the display device (organic EL display device) and the light emitting element (organic EL element) described in Examples are illustrative and can be changed appropriately. The method for manufacturing the display device is also illustrative and can be changed appropriately. In Examples, one pixel is constituted exclusively by three sub-pixels using a combination of a white light emitting element and a color filter. However, for example, one pixel may be constituted by four sub-pixels obtained by adding a light emitting element that emits white light. Alternatively, as the light emitting element, a light emitting element in which an organic layer generates red, a light emitting element in which an organic layer generates green, and a light emitting element in which an organic layer generates blue may be used, and one pixel may be formed by combining these three kinds of light emitting elements (sub-pixels). In Examples, the light emitting element driving unit is constituted by MOSFET, but can be also constituted by TFT. The end face of the organic layer may be perpendicular to the base body, may be inclined with respect to the base body, or may be curved. The first electrode and the second electrode may each have a single layer structure or a multilayer structure.

A light shielding layer may be disposed between a light emitting element and a light emitting element in order to prevent light emitted from a certain light emitting element from entering a light emitting element adjacent to the certain light emitting element to cause optical crosstalk. In other words, a groove may be formed between a light emitting element and a light emitting element, and the groove may be filled with a light shielding material to form the light shielding layer. By disposing the light shielding layer in this way, it is possible to reduce a ratio at which light emitted from a certain light emitting element enters an adjacent light emitting element, and to suppress occurrence of a phenomenon that color mixing occurs and chromaticity of the entire pixels is shifted from desired chromaticity. In addition, color mixing can be prevented. Therefore, color purity increases when monochromatic light is emitted from a pixel, and a chromaticity point is deep. Therefore, a color gamut is widened, and a range of color expression of the display device is widened. Furthermore, a color filter is disposed for each pixel in order to increase color purity. In some configurations of the light emitting element, it is possible to reduce the film thickness of the color filter or to omit the color filter, and it is possible to extract light absorbed by the color filter. As a result, this leads to improvement of luminous efficiency. Alternatively, a light shielding property may be imparted to the black matrix layer BM.

Alternatively, a color filter may be formed on a surface side of the first substrate 11 opposed to the second substrate 41. In other words, an on-chip color filter (OCCF) may be formed on the first substrate. Specifically, the color filters $CF_R$, $CF_G$, and $CF_B$, and the black matrix layer BM may be formed on a surface of the protective film 35 opposed to the resin layer (sealing resin layer) 36. Furthermore, the display device may be a bottom emission type display device that emits light from the first substrate 11.

Note that the present disclosure may have the following configurations.

[A01] «Light Emitting Element»
A light emitting element including:
a base body;
a first electrode formed on the base body;
an organic layer formed on the first electrode and having at least a light emitting layer; and
a second electrode formed on the organic layer, in which the second electrode has at least two edge portions opposed to each other, and
each of the edge portions of the second electrode protrudes from an end face of the organic layer.

[A02] The light emitting element according to [A01], in which a void is present immediately below each of the edge portions of the second electrode protruding from the end face of the organic layer.

[A03] The light emitting element according to [A01], further including a protective film covering the second electrode, in which
the protective film extends immediately below each of the edge portions of the second electrode protruding from the end face of the organic layer.

[A04] The light emitting element according to [A01], further including a protective film covering the second electrode, in which
a void is present adjacent to the organic layer in a part immediately below each of the edge portions of the second electrode protruding from the end face of the organic layer, and
the protective film extends to another portion immediately below each of the edge portions of the second electrode protruding from an edge portion of the organic layer.

[A05] The light emitting element according to any one of [A01] to [A04], further including an insulation layer formed on the base body and having an opening in which the first electrode is exposed to a bottom, in which
the organic layer is formed at least on the first electrode exposed to the bottom of the opening.

[A06] The light emitting element according to [A05], in which the insulation layer is formed so as to cover a portion from the first electrode to the base body.

[A07] The light emitting element according to any one of [A01] to [A04], further including an insulation layer formed on the base body and formed so as to surround the first electrode.

[A08] The light emitting element according to any one of [A01] to [A07], in which
the second electrode is isolated at a portion between light emitting elements adjacent in a first direction,
the second electrode is common to light emitting elements adjacent in a second direction different from the first direction,
the second electrode has two edge portions opposed to each other, and
the two edge portions opposed to each other extend in the second direction.

[A09] The light emitting element according to any one of [A01] to [A07], in which
the second electrode is isolated at a portion between light emitting elements adjacent in a first direction, and the second electrode is isolated at a portion between light emitting elements adjacent in a second direction different from the first direction,
the second electrode has four edge portions opposed to one another,
two of the edge portions opposed to each other extend in the first direction, and
the remaining two edge portions opposed to each other extend in the second direction.

[A10] The light emitting element according to [A09], in which a common electrode common to adjacent light emitting elements is formed on the second electrode.

[B01] «Display device»

A display device including:
a first substrate; a second substrate; and
a plurality of light emitting elements positioned between the first substrate and the second substrate and arranged in a two-dimensional matrix, in which
each of the light emitting elements includes:
a first electrode formed on a base body disposed on the first substrate;
an organic layer formed on the first electrode and having at least a light emitting layer; and
a second electrode formed on the organic layer,
the second electrode has at least two edge portions opposed to each other, and
each of the edge portions of the second electrode protrudes from an end face of the organic layer.

[B02] «Display device»

A display device including: a first substrate; a second substrate; and an image display unit sandwiched by the first substrate and the second substrate, in which
in the image display unit, a plurality of the light emitting elements according to any one of [A01] to [A10] is arranged in a two-dimensional matrix.

REFERENCE SIGNS LIST 10, 10R, 10G, 10B Light emitting element
11 First substrate
20 Transistor
21 Gate electrode
22 Gate insulation layer
23 Channel forming region
24 Source/drain region
25 Element isolating region
26 Base body (interlayer insulation layer)
28 Insulation layer
27 Contact plug
29 Opening
31 First electrode
32 Second electrode
32A, 32B, 32C, 32D Edge portion of second electrode
33 Organic layer
33' End face of organic layer
34 Void
35 Protective film
36 Sealing resin layer
37 Common electrode
41 Second substrate
$CF_R$, $CF_G$, $CF_B$ Color filter
BM Black matrix layer

The invention claimed is:

1. A light emitting device comprising:
a base body; and
a plurality of light emitting elements formed on the base body,
wherein each of the light emitting elements comprises:
a first electrode formed on the base body,
an organic layer formed on the first electrode and having at least a light emitting layer, and
a second electrode formed on the organic layer,
wherein:
the second electrode is isolated between adjacent at least a first pair of the light emitting elements in a first direction,
the second electrode is common between adjacent at least a second pair of the light emitting elements in a second direction different from the first direction,
the second electrode has at least two edge portions opposed to each other,
one of the edge portions protrudes from an end face of the organic layer, and
a void is between an insulation layer and the one of the edge portions.

2. The light emitting device according to claim 1, further comprising:
an insulation layer that covers a portion of the first electrode.

3. The light emitting device according to claim 2, wherein an opening through the insulation layer exposes the first electrode.

4. The light emitting device according to claim 3, wherein the first electrode is between the insulation layer and a base body.

5. The light emitting device according to claim 3, wherein the base body is between the insulation layer and a semiconductor substrate.

6. The light emitting device according to claim 5, wherein the semiconductor substrate comprises a source/drain region of a transistor.

7. The light emitting device according to claim 6, further comprising:
a contact plug in the base body, the contact plug is configured to electrically connect the source/drain region to the first electrode.

8. The light emitting device according to claim 7, wherein the contact plug extends from the first electrode to the source/drain region.

9. The light emitting device according to claim 1, wherein the insulation layer touches the void.

10. The light emitting device according to claim 1, wherein the insulation layer touches the organic layer and the common electrode.

11. A light emitting device comprising:
a base body; and
a plurality of light emitting elements formed on the base body,
wherein each of the light emitting elements comprises:
a first electrode formed on the base body,
an organic layer formed on the first electrode and having at least a light emitting layer, and
a second electrode formed on the organic layer,
wherein:
the second electrode is isolated between adjacent at least a first pair of the light emitting elements in a first direction,
the second electrode is isolated between adjacent at least a second pair of the light emitting elements in a second direction different from the first direction,
the second electrode has at least two edge portions opposed to each other,
a common electrode is between the second electrode and a protective film, and
a void is between the common electrode and an end face of the organic layer.

12. The light emitting device according to claim 11, further comprising:
a sealing resin layer between the protective film and a substrate.

13. The light emitting device according to claim 12, further comprising:
a layer of color filters between the substrate and the sealing resin layer.

14. The light emitting device according to claim 11, wherein the common electrode is between the protective film and the void.

15. The light emitting device according to claim 11, wherein the common electrode touches the protective film and the void.

16. The light emitting device according to claim 11, wherein the void is between the protective film and the end face.

* * * * *